(12) United States Patent
Smith et al.

(10) Patent No.: US 9,525,071 B2
(45) Date of Patent: Dec. 20, 2016

(54) FLEXIBLE HIGH-VOLTAGE THIN FILM TRANSISTORS

(71) Applicants: Melissa Alyson Smith, Cambridge, MA (US); Akintunde I. Akinwande, Newton, MA (US)

(72) Inventors: Melissa Alyson Smith, Cambridge, MA (US); Akintunde I. Akinwande, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/380,270

(22) PCT Filed: Feb. 22, 2013

(86) PCT No.: PCT/US2013/027318
§ 371 (c)(1),
(2) Date: Aug. 21, 2014

(87) PCT Pub. No.: WO2013/126698
PCT Pub. Date: Aug. 29, 2013

(65) Prior Publication Data
US 2015/0001539 A1    Jan. 1, 2015

Related U.S. Application Data

(60) Provisional application No. 61/601,674, filed on Feb. 22, 2012.

(51) Int. Cl.
| | | |
|---|---|---|
| *H01L 29/04* | (2006.01) | |
| *H01L 29/10* | (2006.01) | |
| *H01L 29/76* | (2006.01) | |
| *H01L 29/40* | (2006.01) | |
| *H01L 29/786* | (2006.01) | |
| *H01L 51/10* | (2006.01) | |
| *B81B 3/00* | (2006.01) | |
| *H01L 29/49* | (2006.01) | |
| *H01L 29/51* | (2006.01) | |
| *H01L 51/00* | (2006.01) | |
| *H01L 51/05* | (2006.01) | |

(52) U.S. Cl.
CPC ........ *H01L 29/78663* (2013.01); *B81B 3/0086* (2013.01); *H01L 29/4908* (2013.01);
(Continued)

(58) Field of Classification Search
CPC ............... H01L 51/0533; H01L 29/51; H01L 29/78663; H01L 29/4908; H01L 51/097; H01L 51/10; H01L 51/0054; H01L 51/0055; B81B 3/0086; B81B 2207/15; Y02E 10/549
(Continued)

(56) References Cited

U.S. PATENT DOCUMENTS

| | | |
|---|---|---|
| 4,752,814 A | 6/1988 | Tuan |
| 5,005,056 A | 4/1991 | Motai et al. |

(Continued)

OTHER PUBLICATIONS

International Preliminary Report on Patentability dated May 12, 2015 issued in corresponding PCT Application No. PCT/US2013/027318.

(Continued)

*Primary Examiner* — Dzung Tran
(74) *Attorney, Agent, or Firm* — Wolf, Greenfield & Sacks, P.C.

(57) ABSTRACT

A flexible high-voltage thin-film transistor includes a gate electrode, a source electrode, a drain electrode, a dielectric layer, and a flexible semiconductor layer. The flexible semiconductor layer serves as a channel for the transistor and is in electrical communication with the source electrode and the drain electrode. The drain electrode is laterally offset from the gate electrode. The dielectric layers is configured and arranged with respect to other elements of the transistor such that the transistor is stably operable to facilitate switching of relatively high drain voltages using relatively small controlling gate voltages.

14 Claims, 25 Drawing Sheets

(52) U.S. Cl.
CPC .......... *H01L 29/51* (2013.01); *H01L 51/0097* (2013.01); *H01L 51/10* (2013.01); *B81B 2207/015* (2013.01); *H01L 51/0054* (2013.01); *H01L 51/0055* (2013.01); *H01L 51/0533* (2013.01); *Y02E 10/549* (2013.01)

(58) Field of Classification Search
USPC ...... 257/57, 288, 66, 786, 347; 438/149, 99, 438/680
See application file for complete search history.

(56) References Cited

U.S. PATENT DOCUMENTS

| | | | |
|---|---|---|---|
| 5,083,175 A * | 1/1992 | Hack et al. | 257/53 |
| 6,559,052 B2 | 5/2003 | Li et al. | |
| 6,809,851 B1 | 10/2004 | Gurcan | |
| 6,912,082 B1 | 6/2005 | Lu et al. | |
| 2002/0164891 A1* | 11/2002 | Gates et al. | 438/780 |
| 2005/0001210 A1* | 1/2005 | Lee et al. | 257/40 |
| 2005/0285540 A1* | 12/2005 | Koo et al. | 315/169.1 |
| 2006/0131570 A1* | 6/2006 | Meng | 257/40 |
| 2007/0066020 A1 | 3/2007 | Beach | |
| 2008/0012151 A1 | 1/2008 | Kemppainen et al. | |
| 2010/0051917 A1 | 3/2010 | Kippelen et al. | |
| 2010/0072467 A1 | 3/2010 | Yamazaki et al. | |
| 2010/0213517 A1 | 8/2010 | Sonsky et al. | |

OTHER PUBLICATIONS

International Search Report dated Apr. 26, 2013 issued in corresponding PCT Application No. PCT/US2013/027318.
Written Opinion of the International Searching Authority dated Apr. 26, 2013 issued in corresponding PCT Application No. PCT/US2013/027318.

* cited by examiner

Prior Art

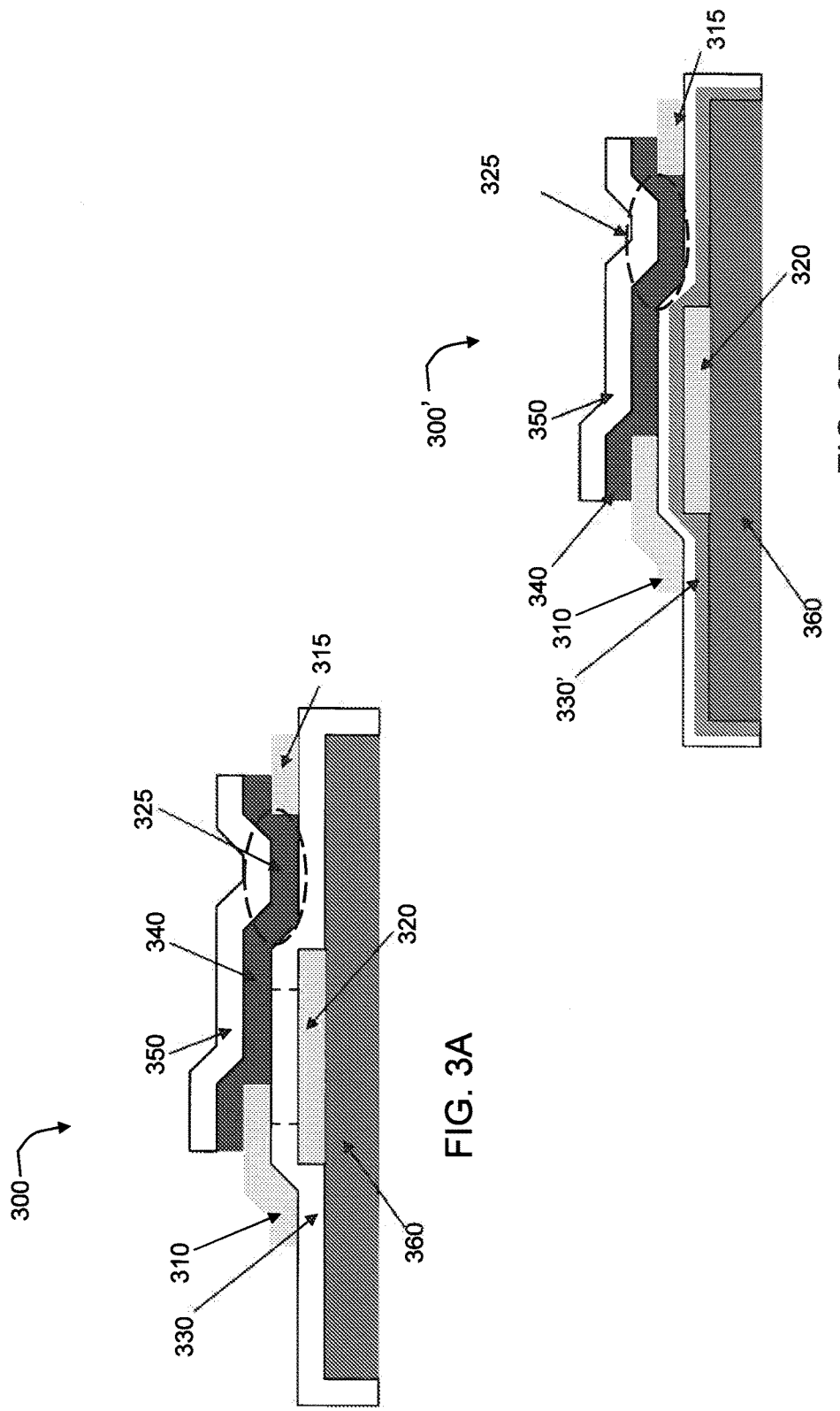

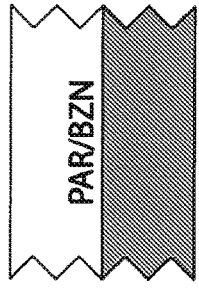
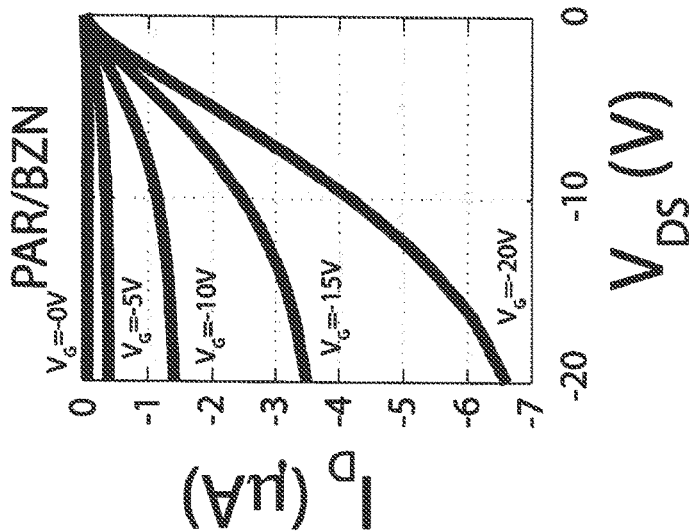
FIG. 6B
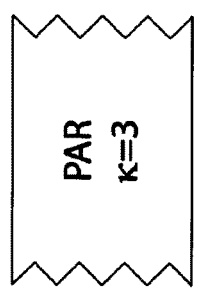
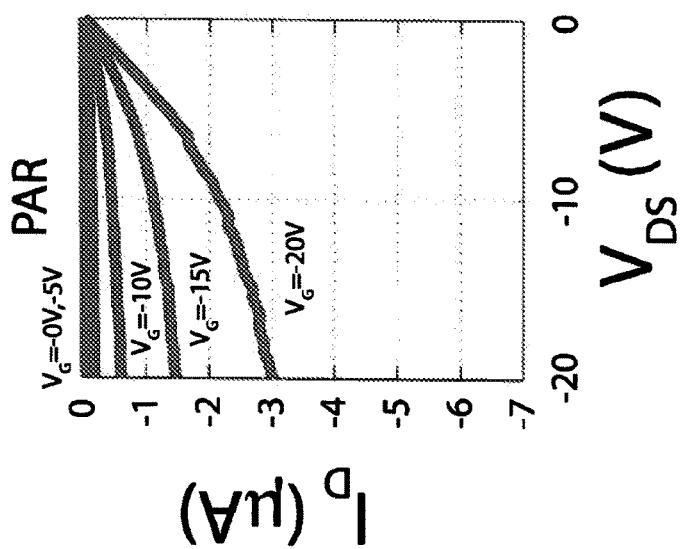
FIG. 6A $$E_{lateral} = \frac{V_{DS}}{L} \sim E_{vertical} = \frac{V_{GS}}{t_{ox}}$$

Mask Layout No FieldPlate

Mask Layout With FieldPlate

Actual Device No FieldPlate

Actual Device With FieldPlate

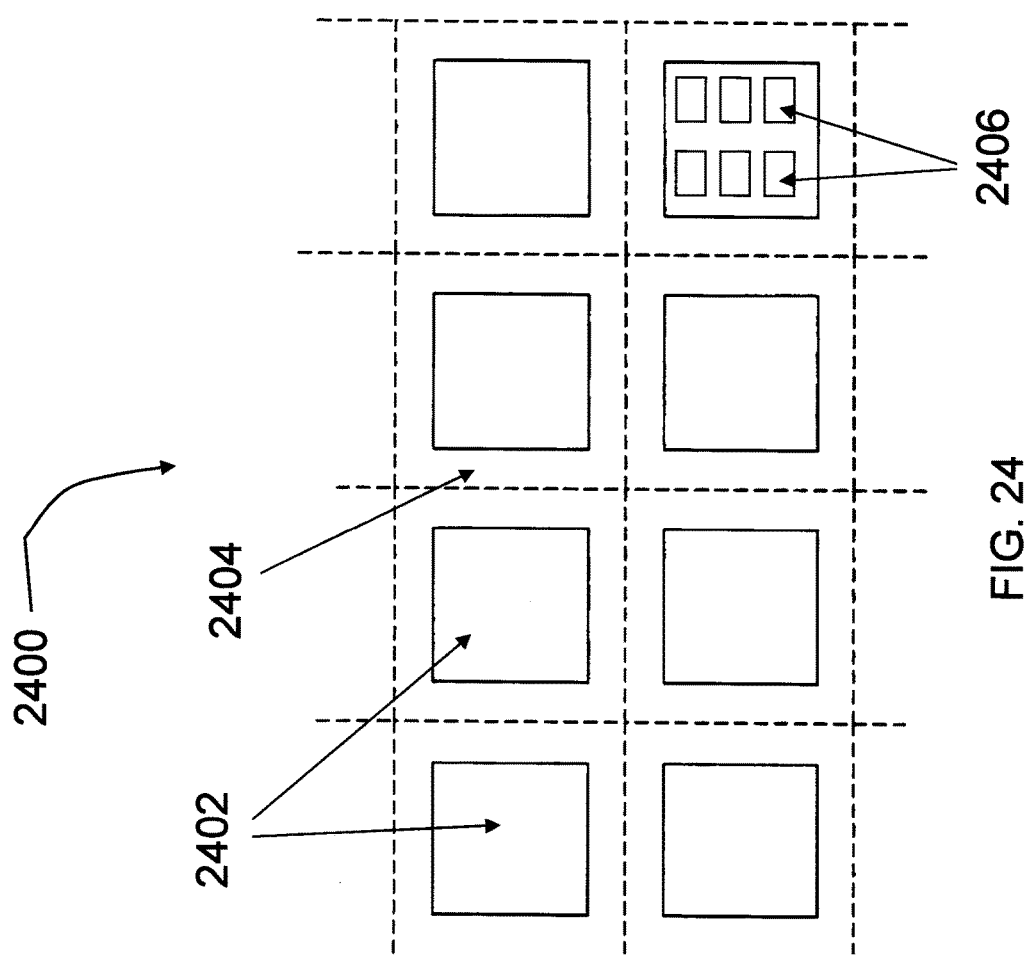

FLEXIBLE HIGH-VOLTAGE THIN FILM TRANSISTORS

CROSS-REFERENCES TO RELATED APPLICATIONS

This application is a U.S. National Phase application of PCT/US2013/027318, filed on Feb. 22, 2013, entitled "FLEXIBLE HIGH-VOLTAGE THIN FILM TRANSISTORS," claims priority to and benefit of U.S. Provisional Application No. 61/601,674, filed on Feb. 22, 2012, entitled "FLEXIBLE HIGH-VOLTAGE THIN FILM TRANSISTOR," which is hereby incorporated herein by reference in its entirety, including drawings.

BACKGROUND

Field-effect transistors are widely used as pixel addressing elements in large-area flat-panel displays, printing and scanning applications. Organic thin-film transistors are attractive for applications such as flexible displays and integrated circuits (IC). The costs associated with their manufacturing processes can be lower than other processes. Recent research and development efforts in thin-film transistors has been focused on developing flexible organic thin film transistors for low-voltage applications.

SUMMARY

The Inventors have recognized and appreciated that a flexible thin film transistor that is configured for stable operations in high-voltage applications would be beneficial. In view of the foregoing, various embodiments are directed generally to flexible high-voltage thin-film transistors, methods for fabricating the flexible high-voltage thin-film transistors, and apparatus and systems that include the flexible high-voltage thin-film transistors.

An example flexible high-voltage thin-film transistor according to the principles of the instant disclosure can include a gate electrode, a source electrode, a drain electrode, and a dielectric layer. A first portion of the dielectric layer is disposed between the gate electrode and the source electrode. A second portion of the dielectric layer is disposed between the gate electrode and the drain electrode. The example flexible high-voltage thin-film transistor also includes a flexible semiconductor layer disposed between, and in electrical communication with, the source electrode and the drain electrode, the flexible semiconductor layer being electrically insulated from the gate electrode. The drain electrode is laterally offset from the gate electrode. The dielectric layer is configured such that a voltage at the drain electrode can be maintained at greater than about 50V in operation of the flexible high-voltage thin-film transistor.

In an example aspect, the dielectric layer can have a dielectric constant that is higher than about 4.0.

In various example aspects, the dielectric layer can have a dielectric constant that is higher than about 4.3, about 4.5, about 4.8, about 5.0, about 5.3, about 5.5, about 6.0, about 6.5, or about 7.0.

The dielectric layer can include an organic material, an inorganic material, or a small molecule.

In an example aspect, the organic dielectric material includes a parylene, a polyvinylphenol, a polyvinylalchohol, a polythienylene vinylene, a functionalized pentacene, a polydimethylsiloxane, or any combination thereof.

In various example aspects, the inorganic dielectric material can include an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

For example, the inorganic dielectric material can include aluminum oxide, bismuth zinc niobate, hafnium oxide, barium strontium titanate, silicon nitride, or any combination thereof.

The flexible semiconductor layer can be formed from amorphous silicon deposited at a temperature below about 200° C., about 300° C., about 400° C., about 800° C., or about 1200° C.

In different example aspects, the flexible semiconductor layer can be formed from a pentacene or a tetracene.

In various example implementations of an operation of the example flexible high-voltage thin-film transistor, a voltage at the drain electrode can be maintained at greater than about 70V, about 85V, about 100V, about 125V, about 150V, about 200V, about 300V, about 400V, about 550V, or about 700V.

In various example implementations of an operation of the example flexible high-voltage thin-film transistor, a voltage at the gate electrode can be maintained at about 3V, about 5V, about 10V, about 15V, about 20V, or about 25V.

In different example aspects, the flexible high-voltage thin-film transistor can further include a field plate disposed proximate to the flexible semiconductor layer at an area between the gate electrode and the drain electrode. The field plate can include a conductive material.

The dielectric layer can include a composite of an organic dielectric material and an inorganic dielectric material.

The organic dielectric material can have a breakdown capacity of greater than about $10^6$ V/cm.

The inorganic dielectric material can have a dielectric constant of greater than about 7.0.

In an example, the source electrode is also laterally offset from the gate electrode. In different aspects of this example, the lateral offset of the source electrode from the gate electrode can be the same as, or different from, the lateral offset of the drain electrode from the gate electrode. In different aspects of this example, the flexible high-voltage thin-film transistor can further include a field plate disposed proximate to the flexible semiconductor layer at an area between the gate electrode and the source electrode. This field plate can include a conductive material.

Another example flexible high-voltage thin-film transistor according to the principles of the instant disclosure can include a gate electrode, a source electrode, a drain electrode, and a composite dielectric layer. The composite dielectric layer can include at least one layer of an organic dielectric material and at least one layer of an inorganic dielectric material. A first portion of the composite dielectric layer is disposed between the gate electrode and the source electrode. A second portion of the composite dielectric layer is disposed between the gate electrode and the drain electrode. The example flexible high-voltage thin-film transistor also includes a flexible semiconductor layer disposed between, and in electrical communication with, the source electrode and the drain electrode, the flexible semiconductor layer being electrically insulated from the gate electrode. The drain electrode is laterally offset from the gate electrode. The composite dielectric layer is configured such that a voltage at the drain electrode can be maintained at greater than about 50V in operation of the flexible high-voltage thin-film transistor.

The composite dielectric layer can include alternating layers, each of the alternating layer including the organic dielectric material or the inorganic material.

The organic dielectric material can have a breakdown capacity of greater than about $10^6$ V/cm.

The inorganic dielectric material can have a dielectric constant of greater than about 7.0.

In an example aspect, the composite dielectric layer can have a dielectric constant that is higher than about 4.0.

In various example aspects, the composite dielectric layer can have a dielectric constant that is higher than about 4.3, about 4.5, about 4.8, about 5.0, about 5.3, about 5.5, about 6.0, about 6.5, or about 7.0.

The organic dielectric material can include an organic material, an inorganic material, or a small molecule.

In an example aspect, the organic dielectric material includes a parylene, a polyvinylphenol, a polyvinylalchohol, a polythienylene vinylene, a functionalized pentacene, a polydimethylsiloxane, or any combination thereof.

In various example aspects, the inorganic dielectric material can include an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

For example, the inorganic dielectric material can include aluminum oxide, bismuth zinc niobate, hafnium oxide, barium strontium titanate, silicon nitride, or any combination thereof.

The flexible semiconductor layer can be formed from amorphous silicon deposited at a temperature below about 200° C., about 300° C., about 400° C., about 800° C., or about 1200° C.

In different example aspects, the flexible semiconductor layer can be formed from a pentacene or a tetracene.

In various example implementations of an operation of the example flexible high-voltage thin-film transistor, a voltage at the drain electrode can be maintained at greater than about 70V, about 85V, about 100V, about 125V, about 150V, about 200V, about 300V, about 400V, about 550V, or about 700V.

In various example implementations of an operation of the example flexible high-voltage thin-film transistor, a voltage at the gate electrode can be maintained at about 3V, about 5V, about 10V, about 15V, about 20V, or about 25V.

In different example aspects, the flexible high-voltage thin-film transistor can further include a field plate disposed proximate to the flexible semiconductor layer at an area between the gate electrode and the drain electrode. The field plate can include a conductive material.

In an example, the source electrode is also laterally offset from the gate electrode. In different aspects of this example, the lateral offset of the source electrode from the gate electrode can be the same as, or different from, the lateral offset of the drain electrode from the gate electrode. In different aspects of this example, the flexible high-voltage thin-film transistor can further include a field plate disposed proximate to the flexible semiconductor layer at an area between the gate electrode and the source electrode. This field plate can include a conductive material.

An example apparatus according to the principles of the instant disclosure can include a flexible substrate, a driver circuit including a plurality of any of the flexible high-voltage thin-film transistors described herein, formed on the flexible substrate, a plurality of micro-electro-mechanical system (MEMS) devices or nano-electro-mechanical system (NEMS) devices formed on the flexible substrate.

In an example configuration, the drain electrode of each of the flexible high-voltage thin-film transistors is in electrical communication with at least one of the MEMS or NEMS devices.

The flexible substrate can include a polyimide, a fabric, a polymer, a plastic, a thin metal foil, a printed circuit board, or paper.

At least one of the plurality of MEMS or NEMS devices can include a piezoelectric component.

An example system according to the principles of the instant disclosure can include a plurality of any of the flexible high-voltage thin-film transistors described herein, or a plurality of any of the apparatus described herein, disposed as separately addressable elements in an array.

An example system according to the principles of the instant disclosure can include a plurality of any of the flexible high-voltage thin-film transistors described herein, or a plurality of any of the apparatus described herein, disposed as separately addressable elements in an imaging array.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 3A shows the cross section of an example flexible high-voltage thin-film transistor, according to principles of the present disclosure.

FIG. 3B shows another example flexible high-voltage thin-film transistor, according to principles of the present disclosure.

FIGS. 6A and 6B show measurements of the output characteristics of example thin film transistors, according to principles of the present disclosure.

FIG. 24 shows an example image sensor according to principles of the present disclosure.

DETAILED DESCRIPTION

Figure 1B:
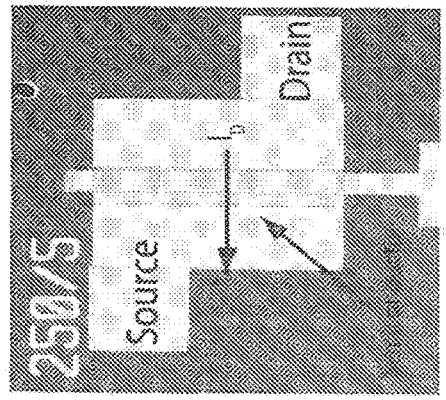
FIG. 1B shows a top view of an example fabricated thin film transistor, according to principles of the present disclosure.

Following below are more detailed descriptions of various concepts related to, and embodiments of, inventive methods, apparatus, and systems including flexible high-voltage thin film transistors, and image sensors and other devices based thereon. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

As used herein, the term "includes" means includes but is not limited to, the term "including" means including but not limited to. The term "based on" means based at least in part on.

With respect to substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom" of a substrate or a layer does not necessarily require that the indicated surface or layer be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/components with respect to the substrate (or other surface) and each other. The terms "disposed on" and "disposed over" encompass the meaning of "embedded in," including "partially embedded in." In addition, reference to feature A being "disposed on," "disposed between," or "disposed over" feature B encompasses examples where feature A is in contact with feature B, as well as examples where other layers and/or other components are positioned between feature A and feature B.

Systems, apparatus and methods according to the principles described herein can be used for fabricating flexible high-voltage thin-film transistors. In a non-limiting example, the flexible high-voltage thin-film transistors are organic semiconductor-based thin-film transistors. A flexible high-voltage thin-film transistor according to the principles herein includes a gate electrode, a source electrode, a drain electrode, and a dielectric layer, and a flexible semiconductor layer. A first portion of the dielectric layer is disposed between the gate electrode and the source electrode. A second portion of the dielectric layer is disposed between the gate electrode and the drain electrode. The flexible semiconductor layer is disposed between, and in electrical communication with, the source electrode and the drain electrode. The flexible semiconductor layer is electrically insulated from the gate electrode. The drain electrode is laterally offset from the gate electrode.

Flexible high-voltage thin-film transistors according to the principles described herein can be operated stably at high drain-to-source voltages with gate voltages no greater than about 20V, even though they are formed with film thickness and geometries that are comparable to those of the organic thin-film transistors in the art. In an example, each layer of the flexible high-voltage thin-film transistors can have a thickness of about 1.0 micron (μm) or less. In an example implementation, the voltage at the drain electrode can be maintained at greater than about 50V. In different example implementations, a flexible high-voltage thin-film transistor according to the principles described herein can be operated at drain-to-source voltages greater than about 70V, greater than about 85V, greater than about 100V, greater than about 125V, greater than about 150V, greater than about 200V, greater than about 300V, greater than about 400V, greater than about 450V, greater than about 550V, or greater than about 700V.

Systems, apparatus and methods are also provided that include at least one of the flexible high-voltage thin-film transistors according to the principles described herein. These systems can be implemented in high-voltage applications. In various non-limiting examples, a high-voltage operation may require a transistor to maintain stable operation at drain-to-source voltages (resulting in output voltages at the drain electrode) of greater than about 50V, greater than about 70V, greater than about 85V, greater than about 100V, greater than about 125V, greater than about 150V, greater than about 200V, greater than about 300V, or greater than about 400V.

The flexible high-voltage thin-film transistors according to the principles described herein exploit the processing advantages of organic materials to provide devices on flexible media, and/or over large areas, that are capable for implementation in applications requiring high voltages.

In an example, the flexible high-voltage thin film transistors described herein can be fabricated using an organic semiconductor technology, using a low temperature lithographic process (≤95° C.) that is compatible with both flexible and rigid substrates.

The flexible high-voltage thin-film transistors according to the principles described herein or systems, apparatus and methods including the same, can be implemented in many applications that require large drive voltages, including drive voltages of 50V or higher, or drive voltages well in excess of 100V. Non-limiting examples of these applications include ferroelectric liquid crystals, electrophoretic displays, (Pb,La)(Zr,Ti)-based electrooptic displays (i.e., PLZT electrooptic displays), and electrographic printers and plotters (xerography). The flexible high-voltage thin-film transistors according to the principles described herein also can be implemented in pixel addressing elements in large-area flat-panel displays, printing and scanning bars. Other non-limiting example implementations of flexible high-voltage thin-film transistors include x-ray detectors and imaging blankets, for example, for military applications, for security applications, and/or for medical diagnosis or treatment.

Also described herein are materials and processing that enable the fabrication of flexible high-voltage thin-film transistors having high mechanical flexibility and providing the flexible high-voltage thin-film transistors with degree of compliance such that they can be caused to conform to flexible substrates.

Systems, apparatus and methods according to the principles described herein also can include a flexible substrate, a driver circuit formed on the flexible substrate, and a plurality of micro-electro-mechanical system (MEMS) devices and/or nano-electro-mechanical systems (NEMS) formed on the flexible substrate. The driver circuit can include at least one of the flexible high-voltage thin-film transistors described herein. The drain electrode of each of the flexible high-voltage thin-film transistors is configured to be in electrical communication with at least one of the MEMS or NEMS devices. In an example, the driver circuit and MEMS or NEMS devices can be formed in an array on the flexible substrate. The drive voltages of the flexible high-voltage thin-film transistors can be used to activate the MEMS or NEMS devices. In an example where the MEMS or NEMS devices include a piezoelectric component, the drive voltages can be used to activate the piezoelectric component.

Non-limiting examples of the flexible substrate include a polyimide, a fabric, a polymer, a plastic, a thin metal foil, a printed circuit board, and paper.

Figure 1D:
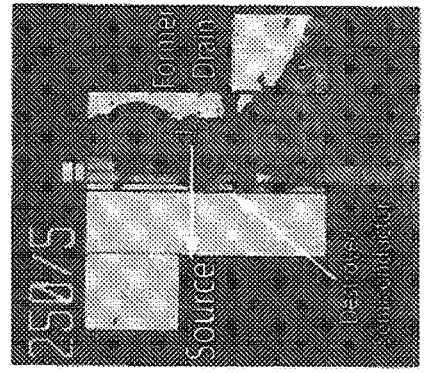
FIG. 1D shows the example thin film transistor of FIG. 1B after high-voltage exposure, according to principles of the present disclosure.
Figure 1A:
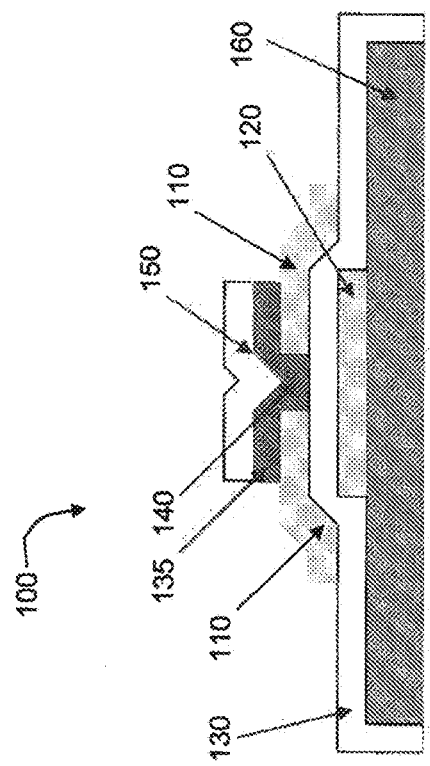
FIG. 1A shows the cross section of an example thin film transistor, according to principles of the present disclosure.
Figure 1C:
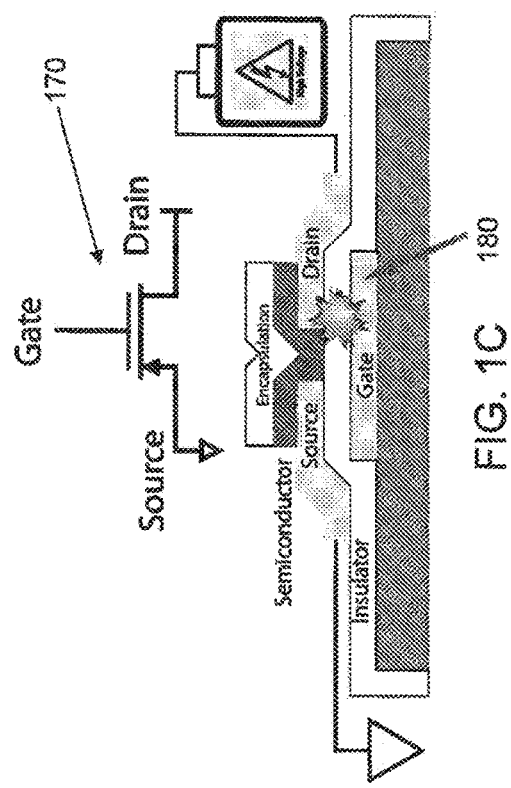
FIG. 1C shows a cross section of a thin film transistor under high-voltage exposure, according to principles of the present disclosure.

FIG. 1A shows the cross section of an example thin film transistor 100. The thin film transistor 100 includes source and drain electrodes 110, a gate electrode 120, and an insulating layer 130. The source and drain electrodes 110 are roughly equidistant from, and both partially overlap, the gate electrode 120. The insulating layer 130 is disposed between the gate electrode 120 and the source and drain electrodes 110. The thin film transistor 100 also includes a semiconductor component 135 disposed over the source and drain electrodes 110 and the insulating layer 130. The portions of the semiconductor component 135 disposed between the source and drain electrodes 110 form a channel region 140. An encapsulation layer 150 is disposed over the channel region 140. The thin film transistor is disposed on a substrate 160. FIG. 1B shows a top view of an example fabricated thin film transistor that includes the components described in connection with FIG. 1A, where the channel region is formed from a semiconductor material. In an organic thin film transistor, the channel region is formed with an organic material. FIG. 1C also shows an equivalent circuit representation 170 of the thin film transistor 100. In operation, the source electrode is maintained at ground potential and the drain electrode is maintained at a non-zero voltage. A voltage applied at the gate electrode is used to control the flow of carriers from the source electrode to the drain electrode (current $I_D$).

Many thin film transistors, including organic thin film transistors, are configured for low-voltage operation. That is, the transistors are configured to maintain lower voltages at the drain electrode, of up to about 20V. Attempts to maintain larger voltages at the drain electrode can result in breakdown of these transistors. For example, as shown in FIG. 1C, a high-voltage exposure from source to drain can result in dielectric breakdown at the region 180 between the gate and drain electrodes. The high voltages cause high electric fields to form between the gate electrode and the drain electrode, and the high electric fields compromise the integrity of the gate insulator. FIG. 1D shows the example thin film transistor of FIG. 1B after high-voltage exposure. As seen in FIG. 1D, both the semiconductor channel region and the gate insulator can be destroyed with the dielectric breakdown.

Figure 2B:
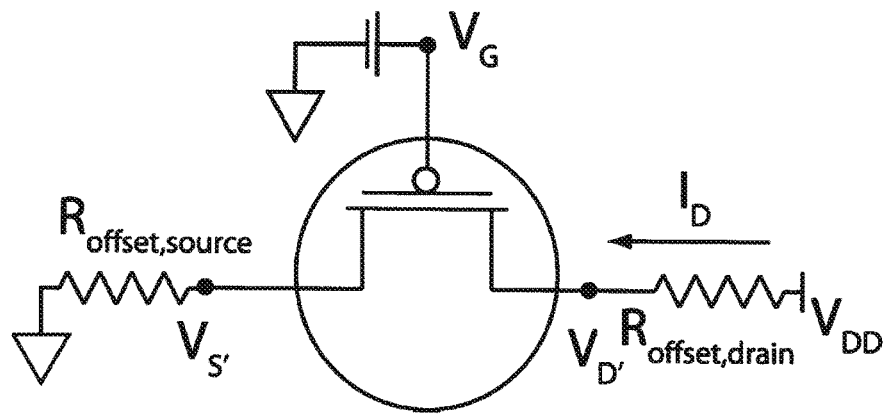
FIG. 2B shows an example simple circuit representation of a thin film transistor, according to principles of the present disclosure.
Figure 2A:
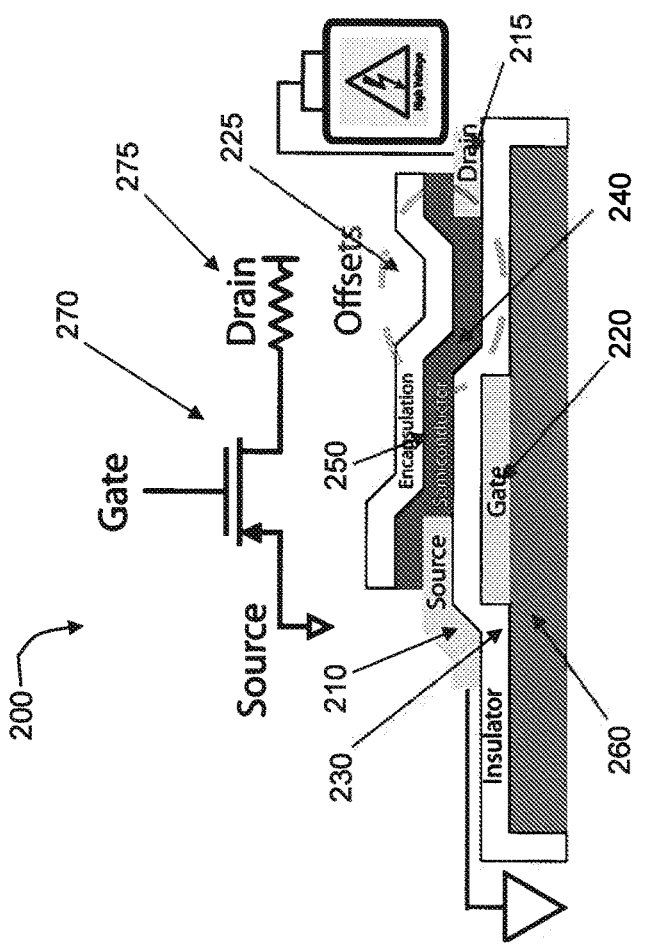
FIG. 2A shows the cross section of an example flexible thin film transistor, according to principles of the present disclosure.

FIG. 2A shows the cross section of an example thin film transistor 200 according to the principles described herein. The thin film transistor 200 includes a source electrode 210, a drain electrode 215, a gate electrode 220, an insulating layer 230, and a channel region 240. In this example, the drain electrode 215 is laterally offset from the gate electrode 220 by an offset region 225. A portion of the insulating layer 230 is disposed between the gate electrode 220 and the source electrode 210. Another portion of the insulating layer 230 is disposed between the gate electrode 220 and the drain electrode 215 and forms a portion of the offset region 225. The channel region 240 is formed in electrical communication with portions of the source electrode 210 and portions of the drain electrode 215. In this example, the insulating layer 230 electrically insulates the channel region 240 from the gate electrode 220. The thin film transistor is disposed on a substrate 260. In operation, the source electrode is maintained at ground potential, the drain electrode is maintained at a non-zero voltage, and the voltage applied at the gate electrode is used to control the flow of carriers from the source electrode to the drain electrode.

In the example thin film transistor of FIG. 2A, the channel region 240 is formed from a semiconductor material. For example, in an organic thin film transistor, the channel region 240 can be formed with an organic material.

FIG. 2A shows an example simplified equivalent circuit representation 270 of the thin film transistor 220, where the offset region is represented as a resistive element 275 added at the drain. FIG. 2B shows an example simple circuit representation of a second example thin film transistor according to the principles described herein. An offset region between the drain and gate electrodes is represented as a resistive element $R_{offset,drain}$ added at the drain. FIG. 2B also shows that an offset region can be introduced between the source and gate electrodes in the second example thin film transistor, and is represented as a resistive element $R_{offset,source}$ added at the source. The source electrode is maintained at ground potential, the drain electrode is maintained at a non-zero voltage ($V_{DD}$), and the voltage ($V_G$) applied at the gate electrode is used to control the flow of carriers from the source electrode to the drain electrode ($I_D$).

The flexible high-voltage thin film transistors according to the principles described herein are configured with an offset region between the drain electrode and the gate electrode. For example, the flexible high-voltage thin film transistors can be fabricated as described in connection with the examples of FIGS. 2A and 2B. In operation, flexible high-voltage thin film transistors according to the principles described herein exploit a reduced electric field the gate and at offset regions, with reduced risk of dielectric breakdown. In the flexible high-voltage thin film transistors, high driving voltages are achieved by offsetting the drain and/or source electrode from the gate electrode, creating an ungated semiconductor region in series with a gated semiconductor region (for example, region 225 of FIG. 2A). The saturation current ($I_{Dsat}$) through the devices is controlled by the gated semiconductor region, limiting the voltage dropped across the ungated region. The limited voltage drop limits the electric field across the ungated semiconductor region. That is, the excess voltage is dropped across the ungated region of the semiconductor layer, enabling high voltage operation. Without the offset, the maximum voltage attainable by a device can be limited to the reliability of the gate insulator. An offset region facilitates high voltage operation.

The flexible high-voltage thin film transistors according to the principles described herein are also configured with gate dielectric layers that present a high effective dielectric constant (such as but not limited to higher than about 4.0) while also exhibiting to high effective electric field breakdown capacity (such as but not limited to higher than about $10^5$ V/cm). In an example implementation, the gate dielectric materials applicable to the flexible high-voltage thin film transistors described herein have an effective dielectric constant higher than about 7.0 and an effective electric field breakdown capacity of greater than about $10^6$ V/cm. In another implementation, the gate dielectric layers can be formed from a composite of an organic dielectric material having a high electric field breakdown capacity (e.g., higher than about $10^5$ V/cm) with an inorganic dielectric material having a high dielectric constant (e.g., higher than about 4.0).

FIG. 3A shows the cross section of an example flexible high-voltage thin-film transistor 300 according to the principles herein, formed in the configuration described in connection with FIG. 2A. The flexible high-voltage thin-film transistor 300 includes a source electrode 310, a drain electrode 315, a gate electrode 320, a dielectric layer 330 (also referred to herein as a gate dielectric layer), a flexible semiconductor layer 340 (as a channel region), and an encapsulation layer 350. As shown in FIG. 3A, a first portion of the dielectric layer 330 is disposed between the gate electrode 320 and the source electrode 310 and a second portion of the dielectric layer 330 is disposed between the gate electrode 320 and the drain electrode 315. The flexible semiconductor layer 340 is disposed between, and in electrical communication with, the source electrode 310 and the drain electrode 315. In this example, the dielectric layer 330 electrically insulates the flexible semiconductor layer 340 from the gate electrode 320. As also shown in FIG. 3A, the drain electrode 315 is laterally offset from the gate electrode 320 by an offset region 325. In an example implementation, the dielectric layer 330 can be fabricated to include an organic material, an inorganic material, or a small molecule.

In a non-limiting example, the source electrode 310, the drain electrode 315 or the gate electrode 320 can have a thickness of about 80 nm to about 100 nm. In a non-limiting example, the dielectric layer 330 can have a thickness of about 100 nm to about 500 nm or higher. In a non-limiting example, the flexible semiconductor layer 340 can have a thickness of about 10 nm to about 40 nm. In a non-limiting example, the encapsulation layer 350 can have a thickness of about 100 nm to about 200 nm.

Non-limiting examples of small molecules include acenes-based small molecules, thiopenes-based small molecules, fullerenes-based small molecules, phhalocyanines-based small molecules, napthalenes-based small molecules, parylene-based small molecules, quinoid-based small molecules, and/or trifluoromethylphenyl-based small molecules.

FIG. 3B shows another example flexible high-voltage thin-film transistor 300' according to the principles herein that includes a source electrode 310, a drain electrode 315, a gate electrode 320, and a flexible semiconductor layer 340, similarly to as described in FIG. 3A, and a dielectric layer 330' that is a composite of an organic dielectric material and an inorganic dielectric material. Dielectric layer 330' can be formed of a composite of an organic dielectric material that has a high electric field breakdown capacity (such as but not limited to higher than about $10^5$ V/cm) and an inorganic dielectric material that has a high dielectric constant (such as but not limited to higher than about 4.0), according to the principles described herein.

The flexible high-voltage thin-film transistor 300 or 300' can be disposed on a flexible substrate 360. Flexible substrate 360 can include a polyimide, a fabric, a polymer, a plastic, a thin metal foil, a printed circuit board, or paper.

Figure 4:
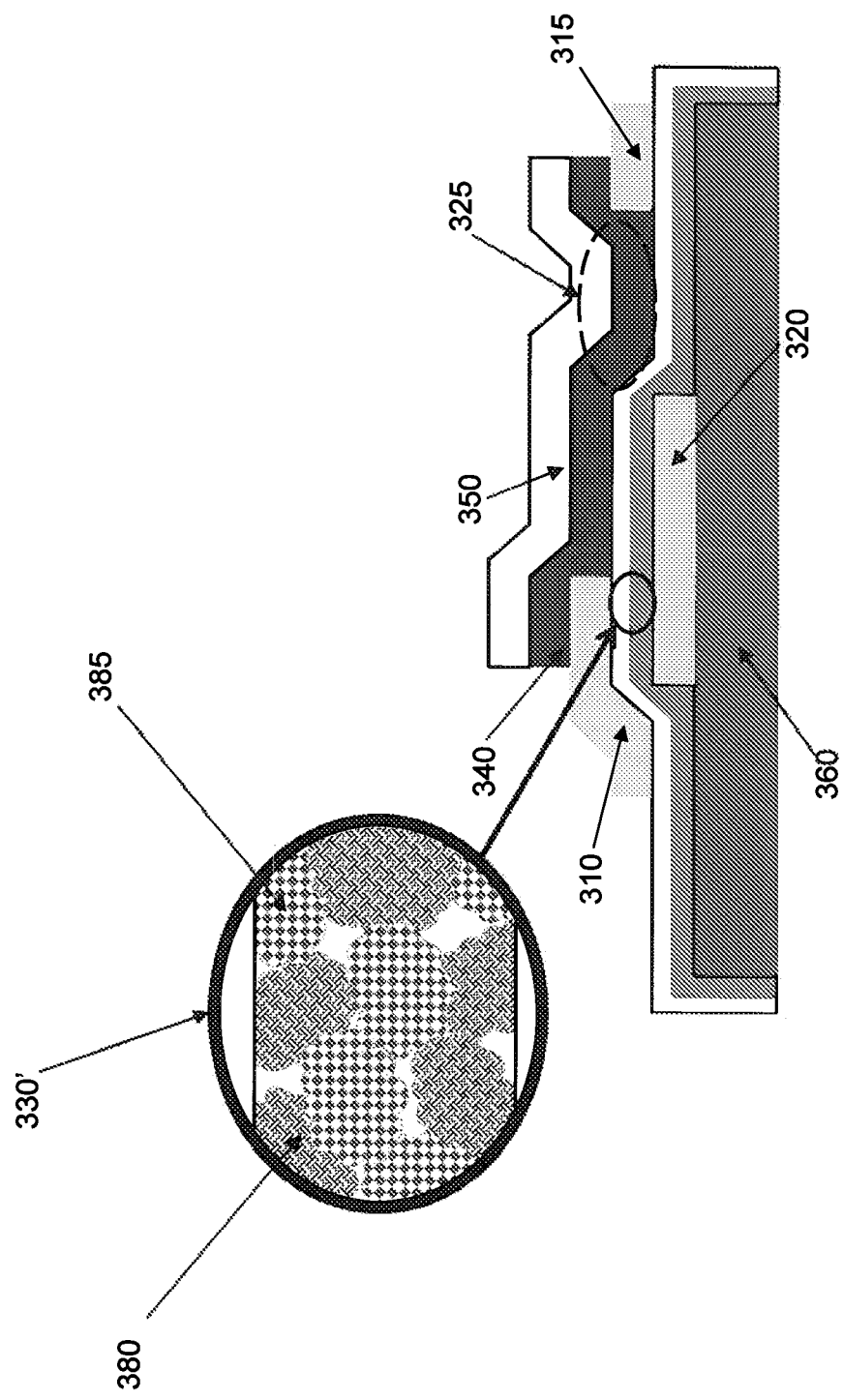
FIG. 4 shows an example flexible high-voltage thin-film transistor, according to principles of the present disclosure.

FIG. 4 shows an example flexible high-voltage thin-film transistor 300' where the dielectric layer 330' is formed as a composite that includes discrete regions of an organic dielectric material 380 and discrete regions of an inorganic dielectric material 385.

Figure 5A:
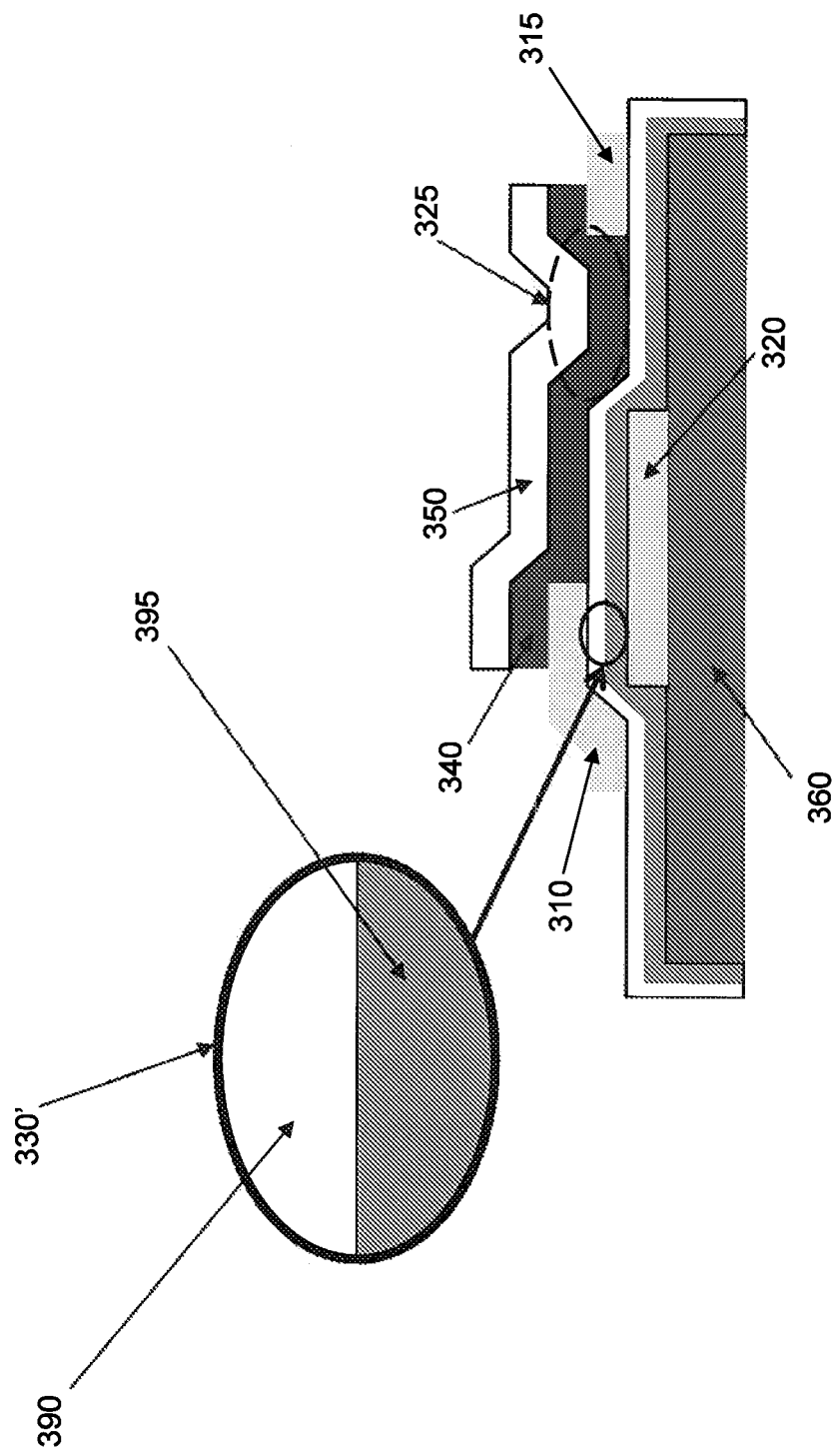
FIG. 5A shows an example flexible high-voltage thin-film transistor, according to principles of the present disclosure.
Figure 5B:
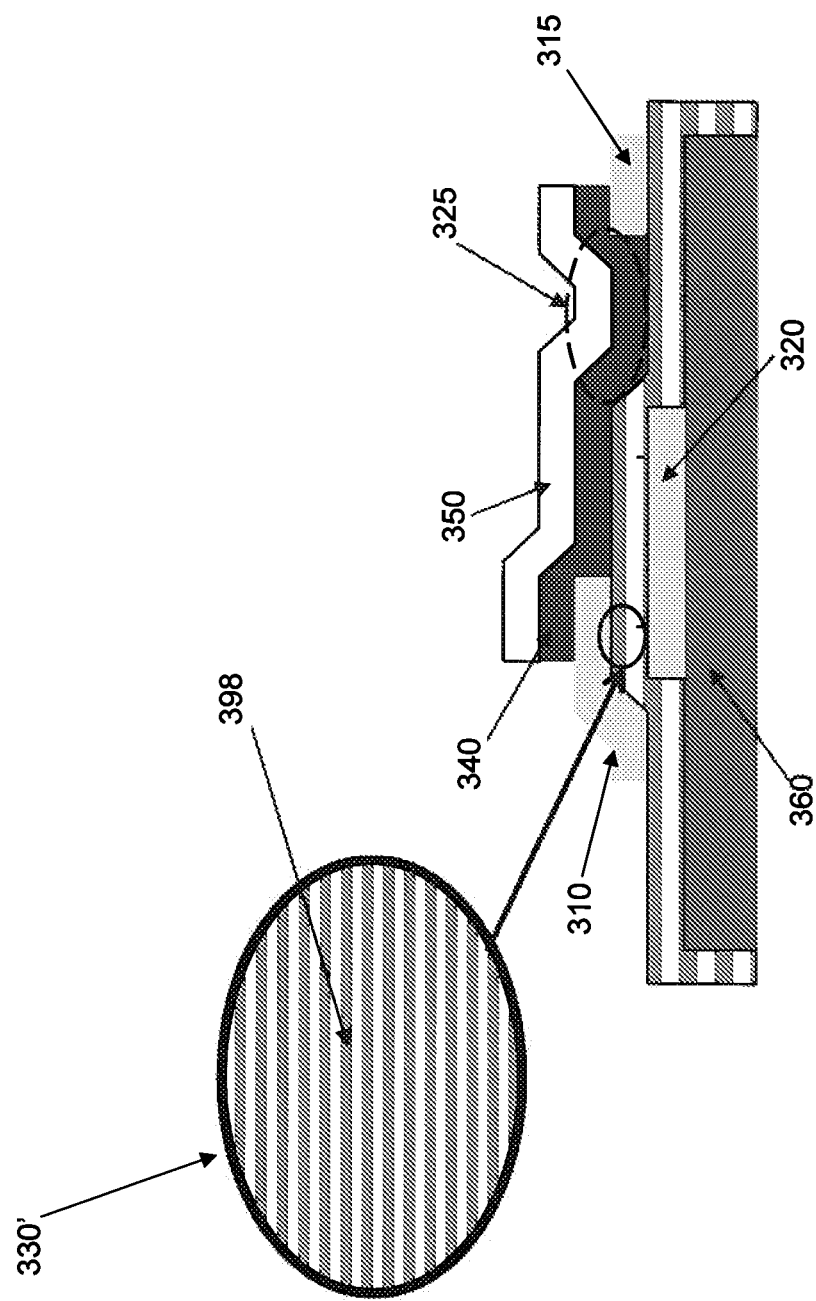
FIG. 5B shows another example flexible high-voltage thin-film transistor, according to principles of the present disclosure.

FIG. 5A shows an example flexible high-voltage thin-film transistor 300' where the dielectric layer 330' is formed from a composite that includes a layer of an organic dielectric material 390 and a layer of an inorganic dielectric material 395. In other example implementations, the dielectric layer 330' can includes more that one layer of the organic dielectric material 390 or more that one layer of the inorganic dielectric material 395. In a non-example, the dielectric layer 330' can be formed from alternating layers of the organic dielectric material 390 and the inorganic dielectric material 395. FIG. 5B shows an example flexible high-voltage thin-film transistor 300' where the dielectric layer 330' is formed from alternating layers 308 of an organic dielectric material and the inorganic dielectric material.

The operation of the flexible high-voltage thin-film transistor 300 or 300' is as described in connection with FIGS. 2A and 2B, and a voltage at the drain electrode 315 of flexible high-voltage thin-film transistor 300 or 300' can be maintained at drain-to-source voltages of greater than about 50V. In other example implementations, a voltage at the drain electrode 315 (drain-to-source voltage) of flexible high-voltage thin-film transistor 300 or 300' can be maintained at greater than about 70V, greater than about 85V, greater than about 100V, greater than about 125V, greater than about 150V, greater than about 200V, greater than about 300V, greater than about 400V, greater than about 550V, or greater than about 700V.

In an example implementation, the dielectric layer 330 or 330' can be fabricated to have a dielectric constant higher than about 4.0. In other example implementations, the dielectric layer 330 can be fabricated to have a dielectric constant that is higher than about 4.3, about 4.5, about 4.8, about 5.0, about 5.3, about 5.5, about 6.0, about 6.5, or about 7.0.

In an example implementation, the dielectric layer 330 or 330' can be fabricated to have a high effective dielectric constant (such as but not limited to higher than about 4.0) while also exhibiting to high effective electric field breakdown capacity (such as but not limited to higher than about $10^5$ V/cm).

In an example implementation, the dielectric layer 330 or 330' can include an organic dielectric material that is fabricated to exhibit an electric field breakdown capacity of greater than about $10^6$ V/cm.

In an example implementation, the dielectric layer 330 or 330' can include an inorganic dielectric material that is fabricated to exhibit a dielectric constant of greater than about 7.0.

In various example implementations, the dielectric layer 330 or 330' can include an organic dielectric material that includes parylene, polyvinylphenol, polyvinylalchohol, polythienylene vinylene, a functionalized pentacene, polydimethylsiloxane, or any combination thereof.

In various example implementations, the dielectric layer 330 or 330' can include an inorganic dielectric material that includes an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

In an example implementation, the dielectric layer 330 or 330' can include an inorganic dielectric material that includes aluminum oxide, bismuth zinc niobate, hafnium oxide, barium strontium titanate, silicon nitride, or any combination thereof.

Figure 5C:
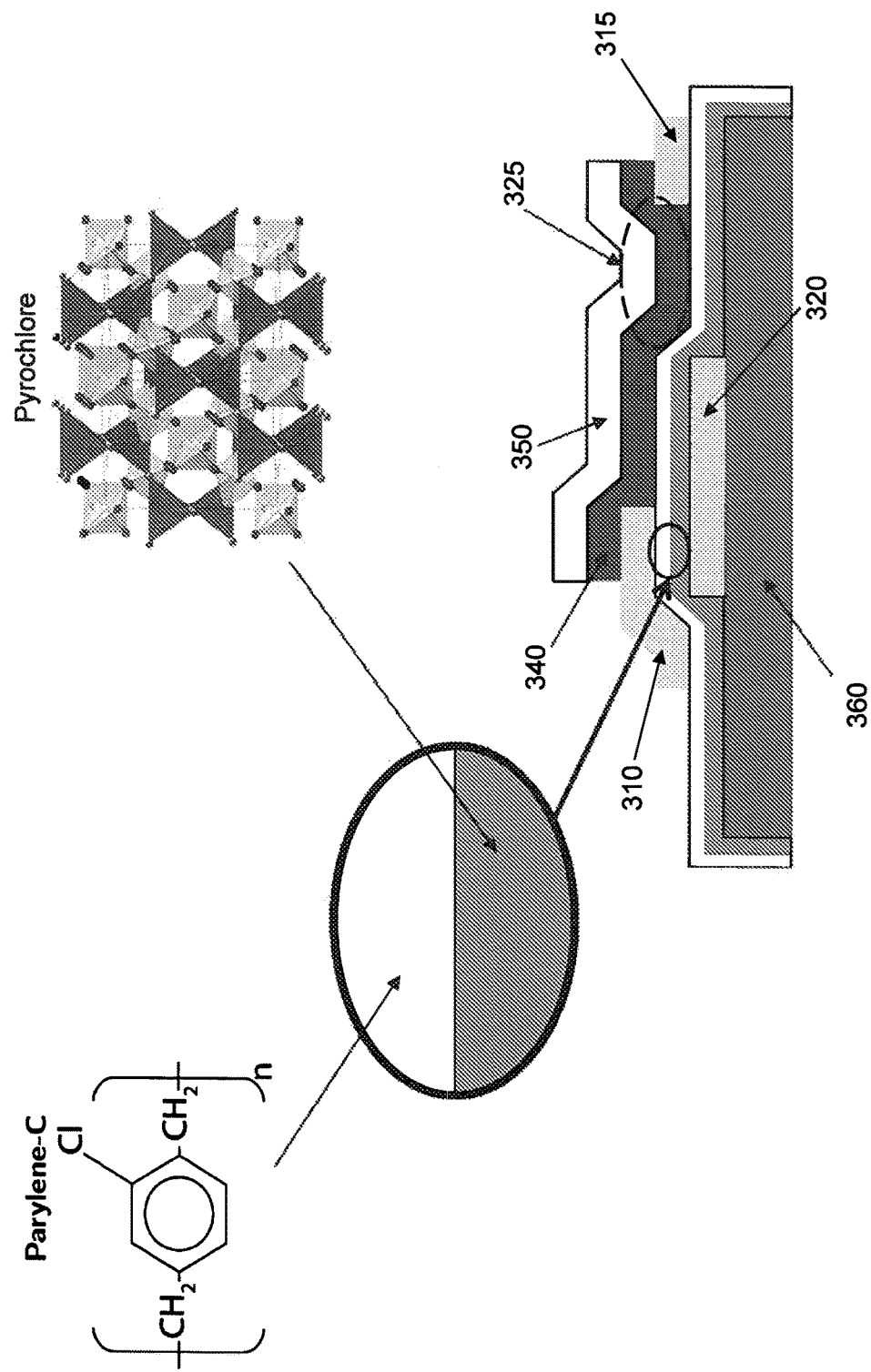
FIG. 5C shows yet another example flexible high-voltage thin-film transistor, according to principles of the present disclosure.

FIG. 5C shows an example flexible high-voltage thin-film transistor 300' where the dielectric layer 330' is formed from a composite with parylene as the organic dielectric material and a pyrochlore. as the inorganic dielectric material. For example, the pyrochlore can be, but is not limited to, a bismuth zinc niobate ($Bi_{1.5}Zn_1Nb_{1.5}O_7$). The resultant dielectric layer 330' combines the advantageous property of the high breakdown properties of parylene-c (electric field breakdown capacity of about 4 MV/cm) with the advantageous property of the high dielectric constant of the bismuth zinc niobate (about 40), to provide a composite material that can withstand the high voltages across the source and drain during high-voltage operation. The parylene-c can be fabricated using a room temperature chemical vapor deposition process and has a dielectric constant of about 3.15. The bismuth zinc niobate can be fabricated using a room temperature radio-frequency (RF) magnetron sputtering process, and has an electric field breakdown capacity of about 0.1 MV/cm). The resultant dielectric layer 330' has an effective dielectric constant of about 6.0 and a high effective electric field breakdown capacity (that is, greater than about $10^6$ V/cm).

In an example implementation, the flexible semiconductor layer 340 of the flexible high-voltage thin-film transistor 330 or 330' can be formed from amorphous silicon deposited at a temperature of about below about 1200° C. or below, about 800° C. or below, about 400° C. or below, about 300° C. or below, or about 200° C. or below. The lower deposition temperature of the amorphous silicon aids to provide a flexible layer that maintains a channel capacity even if the overall flexible high-voltage thin-film transistor is deformed during operation (e.g., it is curved or bent).

In an example implementation, the flexible semiconductor layer 340 of the flexible high-voltage thin-film transistor 330 or 330' can be formed from other types of flexible semiconductor materials, including graphene, semiconducting carbon nanotubes or semiconducting nanoscale material.

In another example implementation, the flexible semiconductor layer 340 of the flexible high-voltage thin-film transistor 330 or 330' can be formed from a pentacene or a tetracene.

In an example implementation, the encapsulation layer 350 of the flexible high-voltage thin-film transistor 330 or 330' can be formed from parylene, polyvinylphenol, polyvinylalchohol, polythienylene vinylene, a functionalized pentacene, polydimethylsiloxane, or any combination thereof.

The source electrode, drain electrode or gate electrode in any example described herein can be formed from a conductive metal, a conductive metal oxide, or other conductive material that facilitates formation of a flexible structure. In an example, the source electrode, drain electrode or gate electrode herein can be based on gold, platinum copper, tantalum, tin, tungsten, titanium, tungsten, cobalt, chromium, silver, nickel or aluminum, or a binary or ternary system of any of these conductive materials.

FIGS. 6A and 6B show measurements of the output characteristics of example thin film transistors. In the device of FIG. 6A, the gate dielectric layer is formed from a 500 nm thick layer of parylene-C (PAR), having a dielectric constant of about 3. In the device of FIG. 6B, the gate dielectric layer is formed from a composite of a 200 nm thick layer of parylene-C and a 200 nm thick layer of bismuth zinc niobate (PAR/BZN) according to the principles describe herein, resulting in an effective dielectric constant of about 6. In both devices, the flexible semiconductor layer is formed from pentacene. FIGS. 6A and 6B show measurements, for each device, of the current at the drain ($I_D$) versus the drain-to-source voltage ($V_{DS}$) at different gate voltages ($V_G$=−0V, −5V, −10V, −15V, −20V). The flexible high-voltage thin-film transistor fabricated according to the principles describe herein (shown in FIG. 6B) is capable of maintaining larger currents ($I_D$) for a given value of $V_G$ and $V_{DS}$, as compared to the device measured in FIG. 6A. For a maximum applied $V_G$=−20V, the maximum attainable current $I_D$ in the device of FIG. 6A is about −3 μA, while maximum attainable current $I_D$ in the device of FIG. 6B is about −6.5 μA.

Figures 7A, 7B:
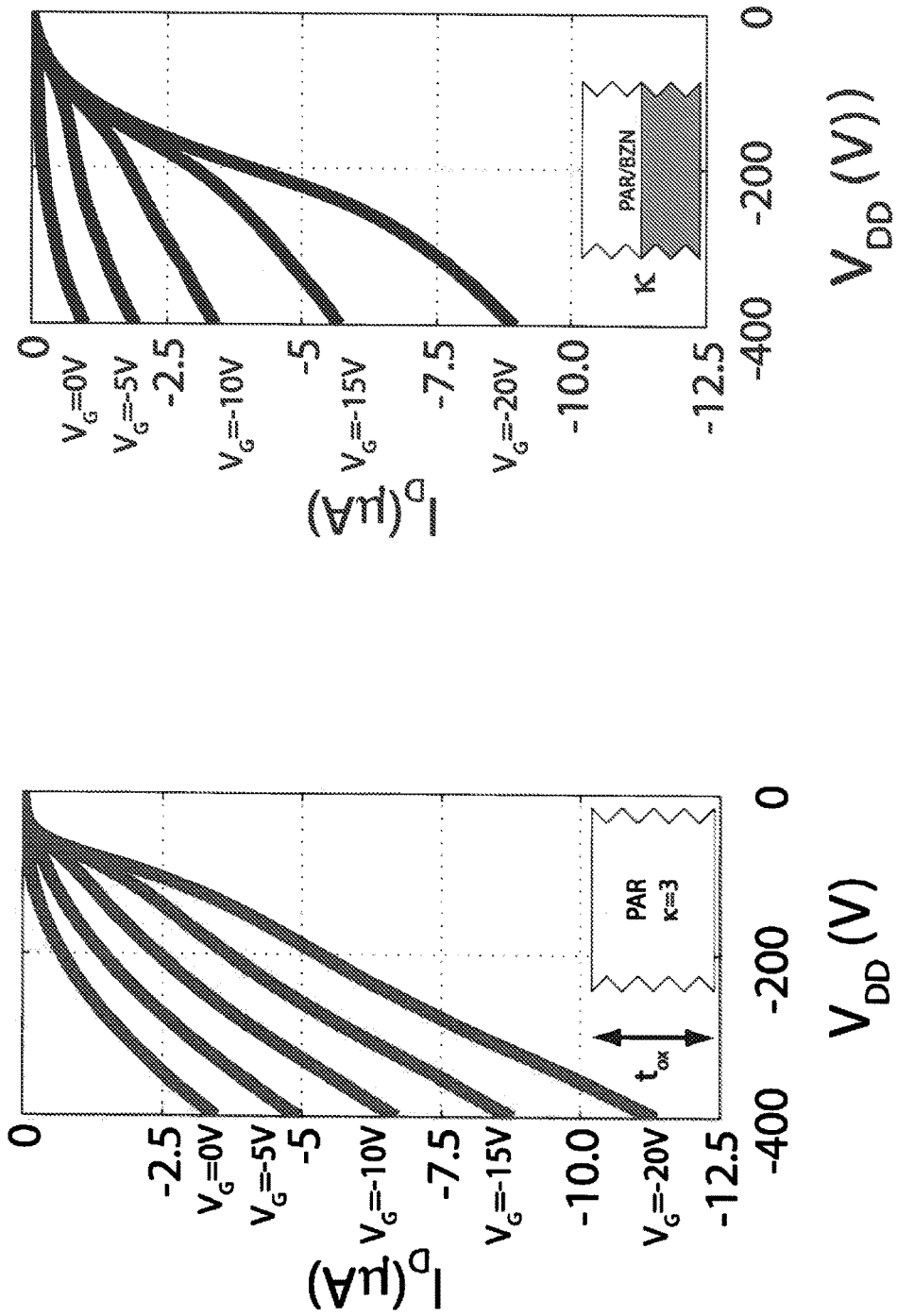
FIGS. 7A and 7B show measurements of the output characteristics of the example thin film transistors of FIGS. 6A and 6B, respectively, during high-voltage operation, according to principles of the present disclosure.

FIGS. 7A and 7B show measurements of the output characteristics of the example thin film transistors of FIGS. 6A and 6B, respectively, for high drain voltages ($V_{DD}$) and different gate voltages ($V_G$=−0V, −5V, −10V, −15V, −20V). In the device of FIG. 7B, the measurements show the degree of gate control of the drain current ($I_D$) for a flexible high-voltage thin-film transistor according to the principles herein. FIG. 7A shows current ($I_D$) measurements of a comparison transistor. In the device of FIG. 7A, the measurements show gate control of the drain current ($I_D$). By comparison, the measurements in FIG. 7B shows better gate control of the drain current ($I_D$) occurring in a flexible high-voltage thin-film field-effect transistor (FET) that is configured for high-voltage operation according to the principles described herein. The measurements in FIG. 7B also demonstrate that the gate dielectric of the flexible high-voltage thin-film FET is modifying the drain current ($I_D$), which results in improved device performance over the FET of FIG. 7A. The measurements of both FIGS. 7A and 7B show high field effects, which is explained in greater detail in connection with FIG. 8. These high-field effects can be reduced or even inhibited with device optimization.

Figure 8:
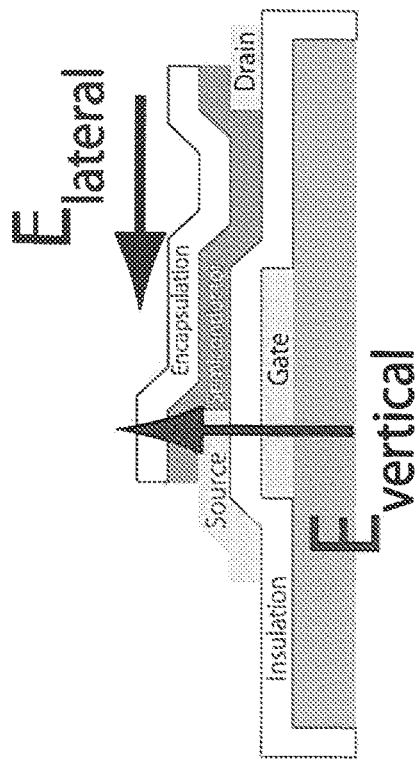
FIG. 8 shows the action of $E_{vertical}$ vs. $E_{lateral}$ in a thin film transistor, according to principles of the present disclosure.
Figures 9A, 9B:
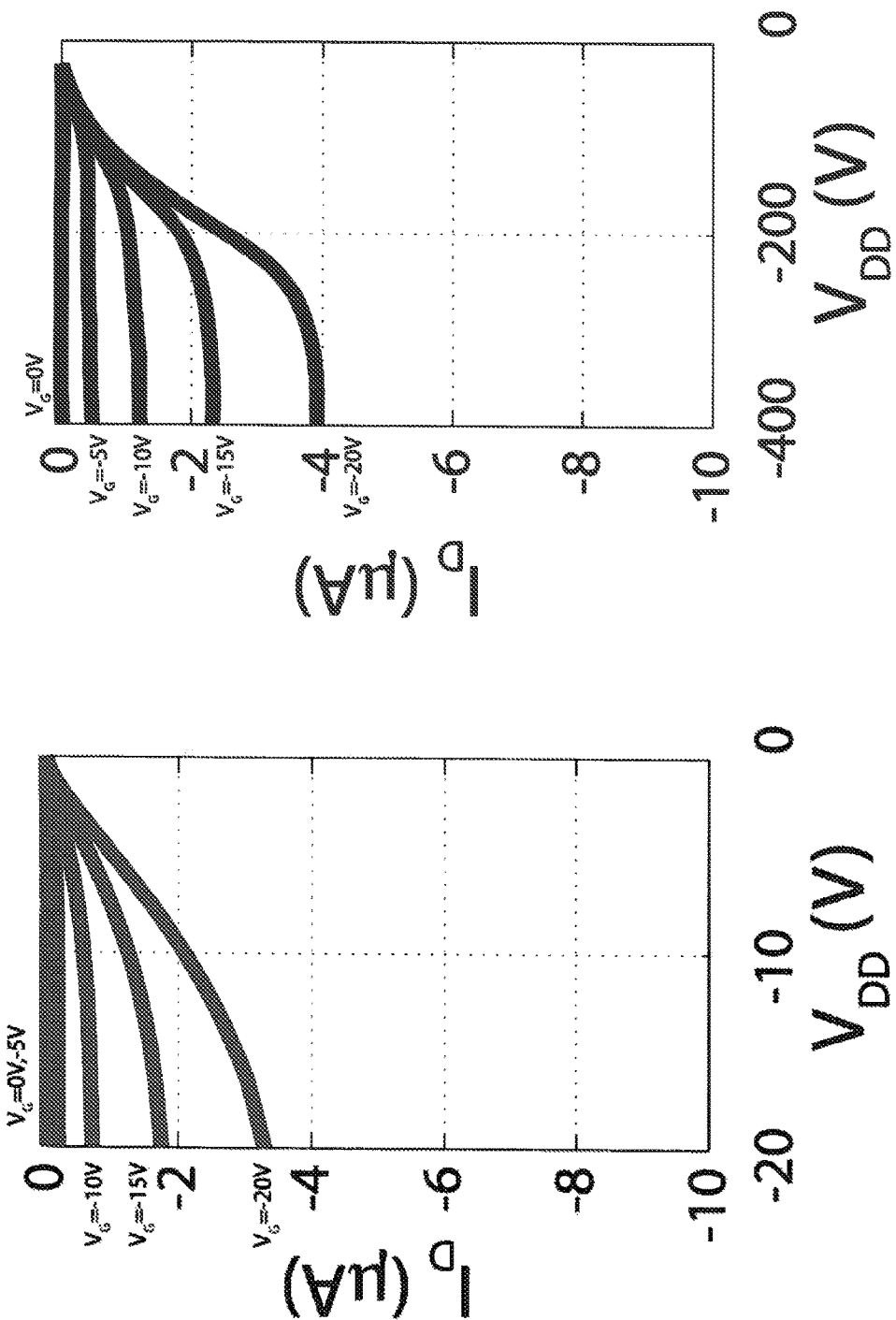
FIG. 9A shows the current ($I_D$) saturation behavior for an example organic thin film transistor, according to principles of the present disclosure.
FIG. 9B shows the current ($I_D$) saturation behavior, corrected for high-field effects, for an example high-voltage thin film transistor, according to principles of the present disclosure.

In a FET, the gate and the drain compete for control over the charge in the channel region. Ideally, the gate controls the charge in the channel, since the vertical electric field ($E_{vertical}$) is larger than the lateral electric field ($E_{lateral}$). FIG. 8 shows the action of $E_{vertical}$ vs. $E_{lateral}$ in a thin film transistor and the computation of $E_{vertical}$ and $E_{lateral}$. The symbol "L" (also referred to as channel length) represents the length of the separation between the source electrode and the drain electrode, while "$t_{ox}$" is the thickness of the gate dielectric. If the lateral electric field becomes comparable to the vertical field in a thin film transistor, the gate may exert less control of the channel and the current characteristics show less saturation, due to a high-field effect. For the example device of FIG. 7B, an example flexible high voltage thin film transistor according to the principles herein with L≥10 μm and $V_{DD}$>300V, the $E_{lateral}$ is greater than about 0.1 MV/cm. When the measurements of FIG. 7B are corrected for high field effects, the current saturation shows more ideal saturation behavior (shown in FIG. 9B) at the high voltages of operation. In an example, correction for high field effects can be achieved by correcting for space charge limited current and correcting for the channel length modulation. For comparison, FIG. 9A shows the current ($I_D$) saturation behavior attainable for an organic thin film transistor that is not configured for high-voltage operation. Both FIGS. 9A and 9B show the gate control and current ($I_D$) saturation behavior expected in a transistor that maintains stable operation. While the organic thin film transistor of FIG. 9A can maintain stable operation at voltages ($V_{DD}$) of up to about −20V, the high-voltage thin film transistor according to the principles described herein (shown in FIG. 9B) can maintain stable operation at voltages ($V_{DD}$) of up to about −400V.

Figure 10:
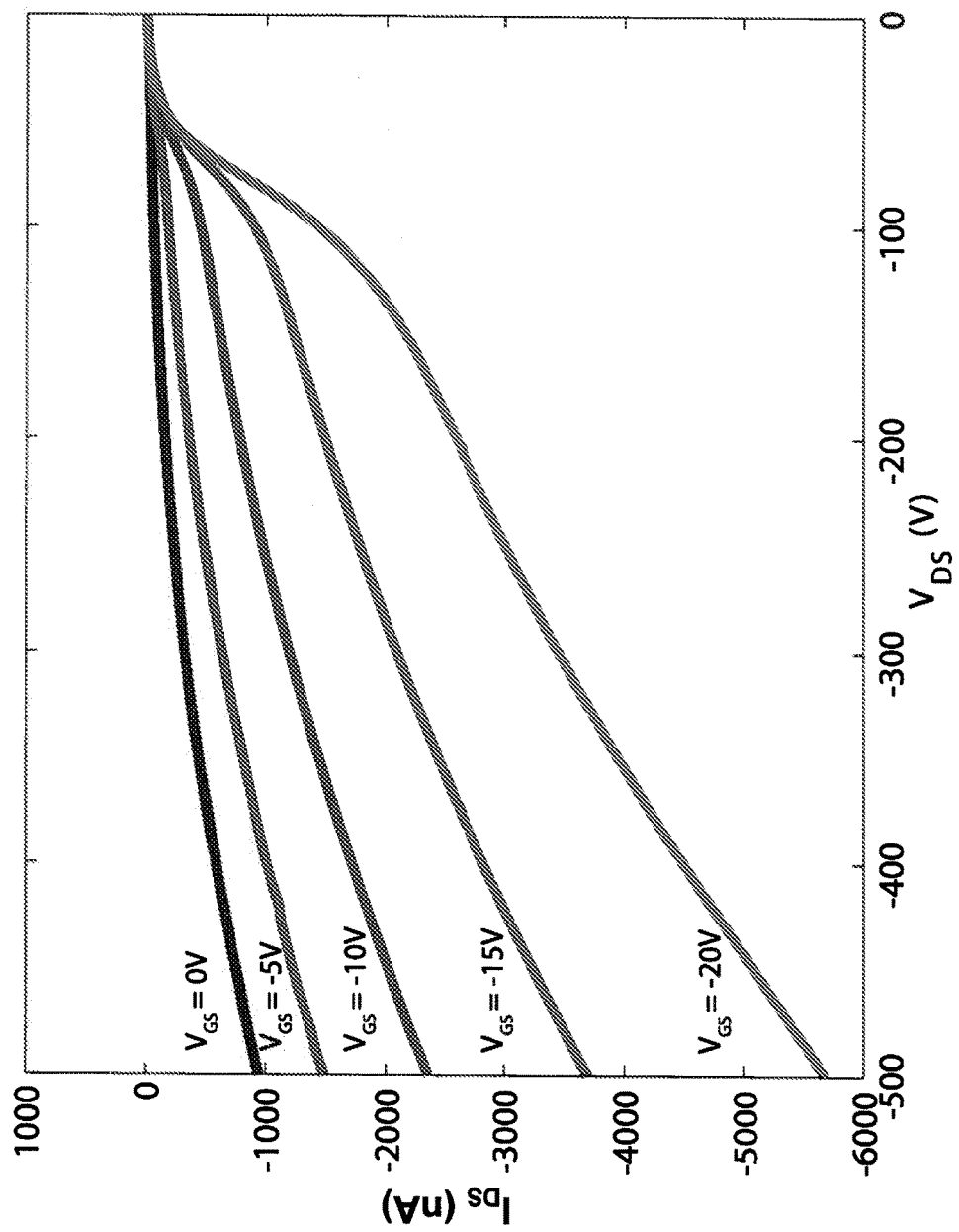
FIG. 10 shows measurements of the output characteristics of an example flexible high-voltage thin film transistor, according to principles of the present disclosure.

FIG. 10 shows measurements of the output characteristics of an example flexible high-voltage thin film transistor according to the principles herein, for high drain-to-source voltages ($V_{DS}$ up to −500V) and different gate voltages ($V_G$=−0V, −5V, −10V, −15V, −20V). The measurements show gate control of the current ($I_D$), with some saturation.

Systems, apparatus and methods are also provided for fabricating the flexible high-voltage thin-film transistors according to the principles herein. The components (including the gate electrode, source/drain electrodes, gate dielectric layer, and flexible semiconductor layer) can be made with materials at relatively low temperatures (<100° C.). As a result, the flexible high-voltage thin-film transistors herein are compatible with many types of substrates featuring flexibility and non-planarity, while maintaining compatibility with other components, including with other integrated circuit components (including ring oscillators, conventional organic thin-film transistors, and logic inverters) and/or MEMS or NEMS components. An added feature is that the electrical performance of the flexible high-voltage thin film transistors described herein can be tuned and engineered for specific applications using the similar methods to those used for organic thin film transistors. In an example, the systems, apparatus and methods herein can be implemented to tune the turn-on voltage and drive current of the flexible high-voltage thin film transistors by engineering the dielectric constant and breakdown capacity of the gate dielectric layer.

The flexible high-voltage thin-film transistors described herein can be fabricated using any technique in the art, including a photolithography process or a shadow masking process. A shadow masking process can be a cheaper process and can produce about 2,000 thin film transistor devices per process cycle, each with features on a scale of about 50 microns. By comparison, a photolithography process can produce about 11,000 thin film transistor devices per process cycle, each with fine features down to a scale of less than about 100 nm. A photolithographic process also can be used to produce a greater variety of device and feature shapes. In addition, a photolithography process can be used to batch fabricate interconnected electronics components and is suitable for integration with, e.g., MEMS or NEMS processing. Photolithography is also desirable as a patterning technique as it is scalable to smaller features and to large areas. Photolithography also can create full isolation (not merely electrical isolation), which is desirable for display applications. Photolithography allows for the creation of arbitrary, fine, free floating patterns with multiple patterning steps, enabling complex circuits on many surfaces.

Figure 11A:
FIGS. 11A to 11E show an example fabrication of a flexible high-voltage thin-film transistor, according to principles of the present disclosure.
Figure 11B:
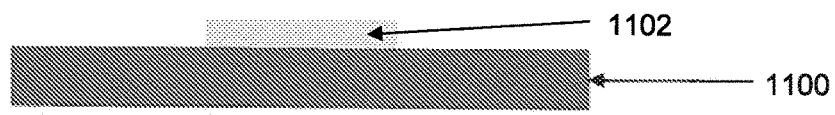
Figure 11C:
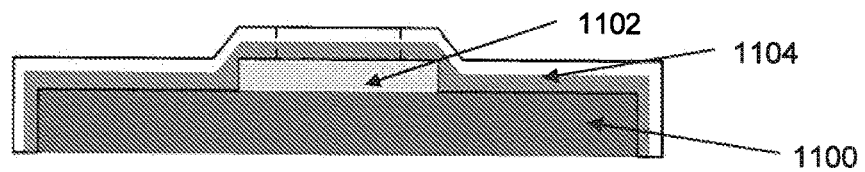
Figure 11D:
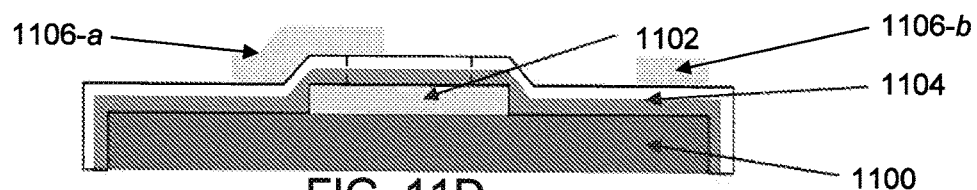
Figure 11E:
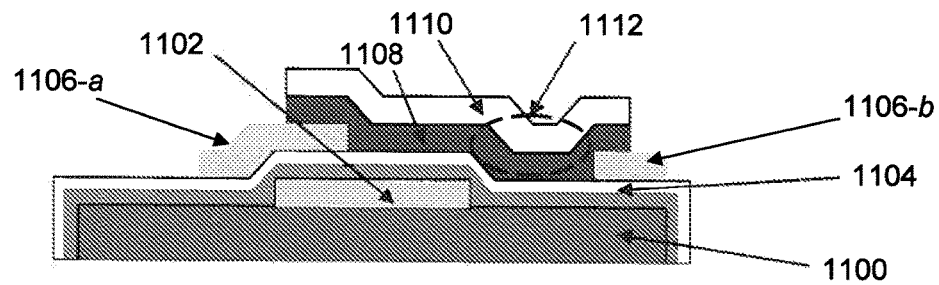

FIGS. 11A to 11E show an example fabrication of a flexible high-voltage thin-film transistor according to the principles herein. While fabrication is described in connection with specific materials or processes, the flexible high-voltage thin-film transistors are not so limited. The materials or processes are selected based on their compatibility with flexible substrates. The example devices of FIG. 11A-E are fabricated on a 100 mm glass wafer 1100. In other examples, the substrate can be, e.g., silicon or a flexible substrate (including a polyimide or any other flexible substrate described herein). For the gate electrode layer, 10 nm of chromium, followed by 80-100 nm of gold are deposited by e-beam evaporation, and patterned by standard photolithography and a wet etch to provide gate electrode 1102 (see FIG. 11B). The gate dielectric 1104 in this non-limiting example is a composite of parylene-C and BZN (see FIG. 11C). In the case of the parylene-C, chemical vapor deposition is used with the substrates at room temperature, and the parylene-C is patterned by photolithography and a dry $O_2$ plasma etch. The BZN is deposited at room temperature via RF magnetron sputtering at 95 W at 9:3 argon to oxygen gas ratio at a pressure of 3 mtorr. The stoichiometry of the sputtering target is $Bi_{1.5}Zn_1Nb_{1.5}O_7$, the intended composition of the BZN film. The BZN is then patterned by photolithography and a very dilute buffered oxide etch (BOE) wet etch. The BZN is then treated with $O_2$ plasma to normalize and stabilize the surface. For the deposition of the source/drain electrodes (1106-*a* and 1106-*b*), shown in FIG. 11D, 80 nm of gold is deposited by e-beam evaporation and patterned by photolithography and a wet etch. If a surface treatment is desired, an $O_2$ plasma can be used to define enhancement ($V_T<0$) and depletion ($V_T>0$) mode devices. However, the systems, methods and apparatus described herein are not limited to an $O_2$ plasma surface treatment. Any number of surface treatments in the art that can be used to reduce dangling bonds and other surface defects are applicable. For example, in another example implementation, a parylene-C surface treatment can be performed. In FIG. 11E, a flexible semiconductor layer 1108 of pentacene is deposited by thermal evaporation to a thickness of about 20-30 nm at a rate ~2 nm/min. As also shown in FIG. 11E, an encapsulation layer 1110 of parylene-C is deposited to protect the pentacene from solvents in the subsequent photolithographic patterning. The definition of the device is completed by a dry etch of the flexible semiconductor layer and the encapsulation layer using an $O_2$ plasma dry etch. FIG. 11E also shows the offset region 1112 that is introduced between the gate electrode 1102 and the drain electrode 1106-*b* in the processing.

Table 1 provides a non-limiting example summary of processing of an example flexible high-voltage thin-film transistor, described in connection with FIG. 11A to 11E and a comparative thin film transistor that uses solely parylene-C as the gate dielectric layer. In Table 1, PAR=Parylene-C, $O_2$ Plasma=$O_2$ plasma treated Parylene-C, PAR/BZN=Parylene-C deposited on BZN (composite gate dielectric). Table 2 provides a summary of the example dimensions of various components of the example flexible high-voltage thin film transistor as compared to a comparative thin film transistor that uses solely parylene-C as the gate dielectric layer.

TABLE 1

Process Map for Fabricating An Example Flexible High-Voltage Thin-Film Transistor.

| Step | Action | Insulator Type | | |
|---|---|---|---|---|
| | | PAR | $O_2$ Plasma | PAR/BZN |
| 1 | | Acquire Vacuum Compatible Substrate | | |
| 2 Gate Definition | Deposition Etch | eBeam Evaporation (Cr followed by Au) Gold Etch and Chrome Etch | | |
| 3 Insulator Definition | Deposition Etch | CVD $O_2$ Plasma | CVD $O_2$ Plasma | RF Spt. (BZN) CVD (PAR) Dilute HF (BZN) $O_2$ Plasma (PAR) |

TABLE 1-continued

Process Map for Fabricating An Example Flexible High-Voltage Thin-Film Transistor.

| Step | Action | Insulator Type | | |
|---|---|---|---|---|
| | | PAR | $O_2$ Plasma | PAR/BZN |
| 4 Source/Drain Definition | Deposition Etch | eBeam Evaporation (Au) Gold Etch | | |
| 4b Surface Treatment | Etch | — | $O_2$ Plasma | — |
| 5 Semiconductor Definition | Deposition Etch | Thermal Evaporation (Pentacene) and CVD (Parylene-C) $O_2$ Plasma | | |

TABLE 2

Thickness of Layers Of An Example Flexible High-Voltage Thin-Film Transistor.

| Layer | Insulator Type | | |
|---|---|---|---|
| | PAR | $O_2$ Plasma | PAR/BZN |
| Encapsulation | Parylene-C 100-200 nm | | |
| Semiconductor/Active | Pentacene 10-40 nm | | |
| Source/Drain | Au 80-100 nm | | |
| Insulator | Parylene-C 300-500 nm | Parylene-C 300-500 nm | Parylene-C 200 nm BZN 200 nm |
| Gate | Cr/Au 10 nm/80-100 nm | | |

The example processes described herein allows for the electrical performance of the flexible high-voltage thin film transistors described herein to be tuned and engineered for specific applications. For example, interfaces in the devices can be engineered to tune the electrical performance of the flexible high-voltage thin film transistors. As an example, the precision of the interface of the flexible semiconductor layer and an insulator of the device (including the gate dielectric layer or the encapsulation layer) can be engineered to tune the electrical performance of the flexible high-voltage thin film transistors. As another example, the precision of the components that form the composite of the gate dielectric layer (as described herein) can be engineered to tune the dielectric constant of the gate dielectric layer, and as a result, to tune the electrical performance of the flexible high-voltage thin film transistors. In other examples, the performance of the device can be tuned by, e.g., by improving the current saturation characteristics, include increasing the gate insulator capacitance, reducing the thickness of the flexible semiconductor layer, and/or increasing the length of the offset region and/or the length of the channel region of the device. The fabrication processing described herein lends itself to interface engineering, and the substitution of insulators with different dielectric constants in the composite of the gate dielectric layer provides a means to control electrical performance of the flexible high-voltage thin film transistors. The interface engineering and insulator selection described herein facilitate controlling and tuning the electrical performance of the flexible high-voltage thin film transistors. Other techniques in the art that can be implemented to tune the performance of the flexible high-voltage thin film transistors are also applicable.

Figure 12A:
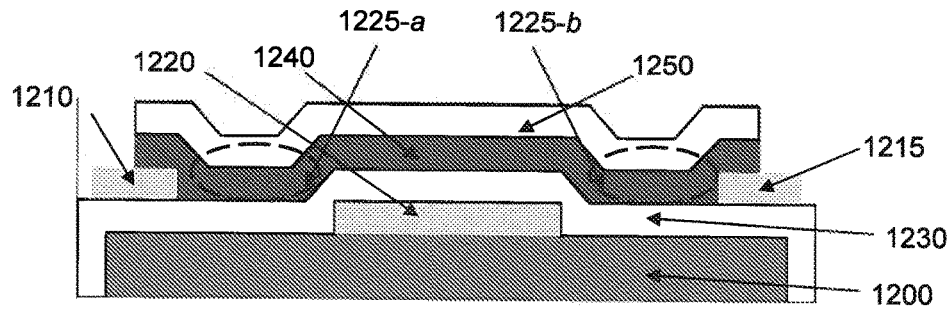
FIGS. 12A to 12D show example configurations of the flexible high-voltage thin film transistors, according to principles of the present disclosure.
Figure 12B:
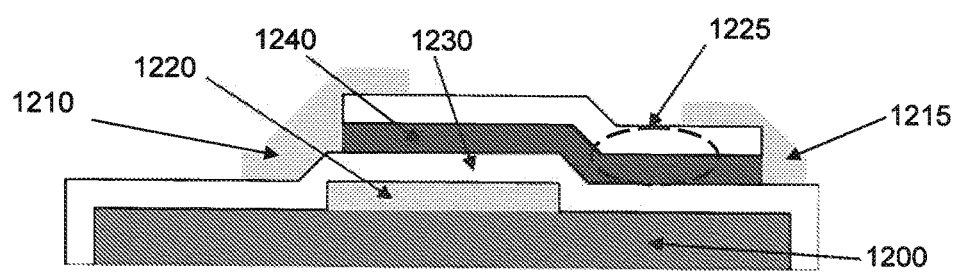
Figure 12C:
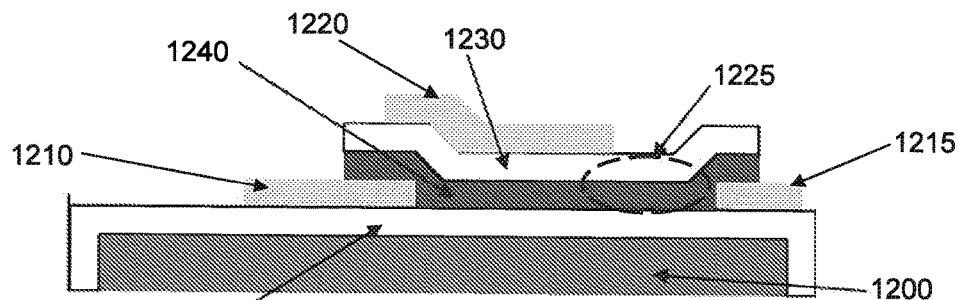
Figure 12D:
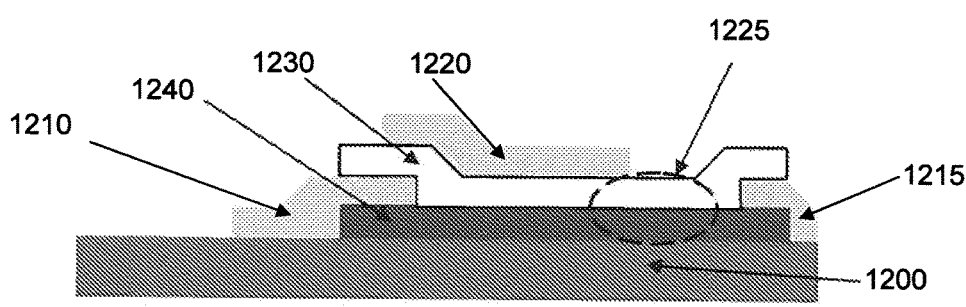

FIGS. 12A to 12D show other example configurations of the flexible high-voltage thin film transistors according to the principles described herein. The descriptions hereinabove of any of the materials composition and layer components of the example flexible high-voltage thin film transistors of FIGS. 3A and 3B are applicable to equivalent components of any example device of FIGS. 12A-12D. FIG. 12A shows an example flexible high-voltage thin-film transistor that includes a source electrode 1210, a drain electrode 1215, a gate electrode 1220, a dielectric layer 1230, a flexible semiconductor layer 1240 (in electrical communication with the source electrode 1210 and drain electrode 1215), and an encapsulation layer 1250, disposed on a substrate 1200. In this example configuration, both the source electrode 1210 and the drain electrode 1215 are offset from the gate electrode by offset regions 1225-a and 1225-b, respectively. FIG. 12B shows an example flexible high-voltage thin-film transistor that includes a source electrode 1210, a drain electrode 1215, a gate electrode 1220, a dielectric layer 1230, and a flexible semiconductor layer 1240 (in electrical communication with the source electrode 1210 and drain electrode 1215), disposed on a substrate 1200. In this example configuration, there is a single offset region 1225, and portions of both the source electrode 1210 and the drain electrode 1215 are disposed above portions of the flexible semiconductor layer 1240. By comparison, for the flexible high-voltage thin film transistors of FIGS. 3A and 3B, portions of both the source electrode and the drain electrode are disposed below portions of the flexible semiconductor layer. FIG. 12C shows another example flexible high-voltage thin-film transistor that includes a source electrode 1210, a drain electrode 1215, a gate electrode 1220, a dielectric layer 1230, a flexible semiconductor layer 1240 (in electrical communication with the source electrode 1210 and drain electrode 1215), and an encapsulation layer 1250, disposed on a substrate 1200. In this example configuration, the gate electrode 1220 is disposed as the top layer of the device, while the source electrode 1210, the drain electrode 1215, and the encapsulation layer 1250 form the bottom layers of the device. In addition, there is a single offset region 1225. FIG. 12D shows another example flexible high-voltage thin-film transistor that includes a source electrode 1210, a drain electrode 1215, a gate electrode 1220, a dielectric layer 1230, and a flexible semiconductor layer 1240 (in electrical communication with the source electrode 1210 and drain electrode 1215), disposed on a substrate 1200. In this example configuration, the gate electrode 1220 is disposed as the top layer of the device, while the source electrode 1210, the drain electrode 1215, and the flexible semiconductor layer 1240 form the bottom layers of the device. Portions of both the source electrode 1210 and the drain electrode 1215 are disposed above portions of the flexible semiconductor layer 1240. In addition, there is a single offset region 1225.

The example flexible high-voltage thin film transistor of FIG. 12A is illustrated as having offset regions 1225-a and 1225-b that are substantially similar in size. In other examples, the size of the lateral offset of offset region 1225-a can be different from the size of the lateral offset of offset region 1225-b.

The example flexible high-voltage thin film transistors described herein are illustrated in FIGS. 2A, 3A-5C, 8, and 11A-14D, as including at least one encapsulation layer. An encapsulation layer can help to preserve device performance and reduce degradation of the device over the long term. However, the flexible high-voltage thin film transistors according to the principles described herein are not limited to including an encapsulation layer. The instant disclosure also encompasses flexible high-voltage thin film transistors that do not include encapsulation layers.

Figure 13:
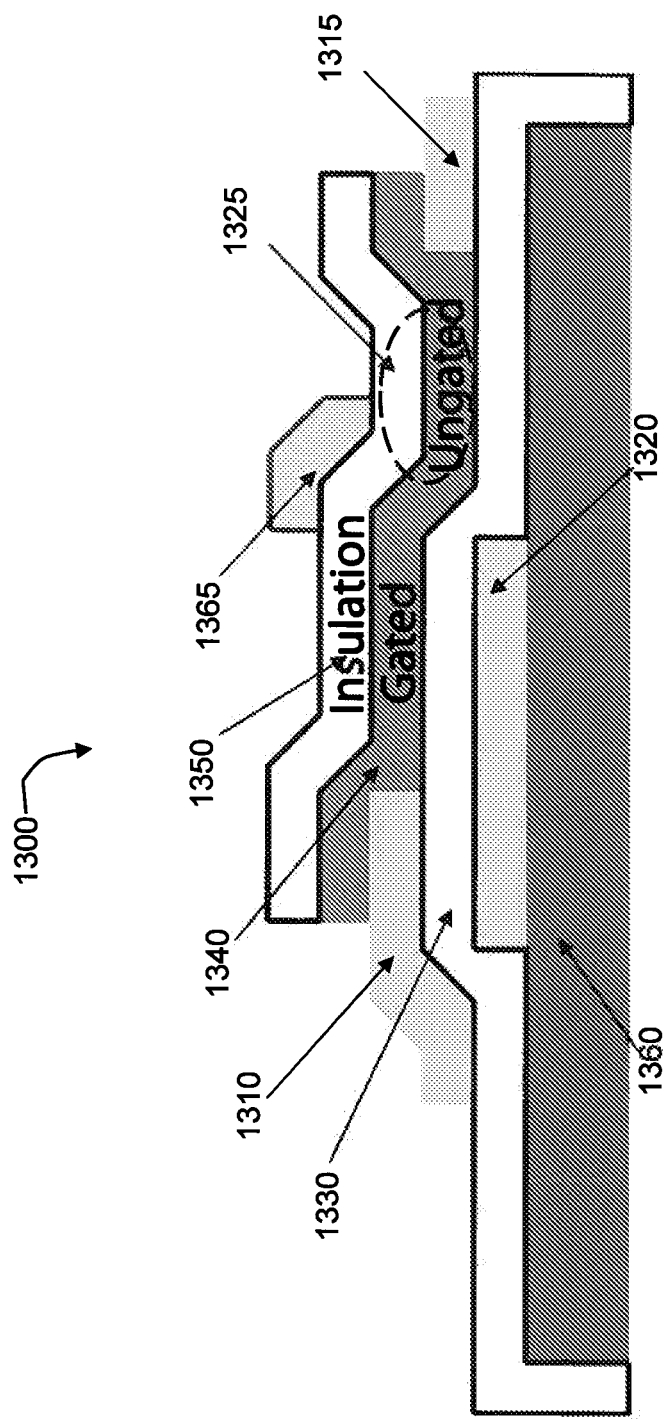
FIG. 13 shows the cross-section of an example flexible high-voltage thin film transistor, according to principles of the present disclosure.

FIG. 13 shows the cross-section of another example flexible high-voltage thin film transistor 1300 according to the principles described herein. The flexible high-voltage thin-film transistor 1300 includes a source electrode 1310, a drain electrode 1315, a gate electrode 1320, a dielectric layer 1330 (also referred to herein as a gate dielectric layer), a flexible semiconductor layer 1340 (as a channel region), and an encapsulation layer 1350, disposed on a substrate 1360. The descriptions hereinabove of any of the materials composition and layer components of the example flexible high-voltage thin film transistors of FIGS. 3A and 3B are applicable to equivalent components of the example device of FIG. 13. As shown in FIG. 13, a first portion of the dielectric layer 1330 is disposed between the gate electrode 1320 and the source electrode 1310 and a second portion of the dielectric layer 1330 is disposed between the gate electrode 1320 and the drain electrode 1315. The flexible semiconductor layer 1340 is disposed between, and in electrical communication with, the source electrode 1310 and the drain electrode 1315. In this example, the dielectric layer 1330 electrically insulates the flexible semiconductor layer 1340 from the gate electrode 1320. As also shown in FIG. 13, the drain electrode 1315 is laterally offset from the gate electrode 1320 by an offset region 1325.

The example flexible high-voltage thin film transistor 1300 also includes a field plate 1365. The field plate 1365 can be introduced to address fringing fields that can develop near the offset regions of the device. These fringing electric fields can create charge traps, resulting in reduced performance of the device. Applying a voltage to the field plate can be used to minimize the charge injection barrier for carriers to traverse the offset region. Applying a voltage to the field plate can be implemented to balance superfluous fields that can develop near the offset regions, resulting in fewer traps being generated (which can trap charge carriers and reduce device performance). The field plate also can be implemented to make the offset region more conductive. As a result, more charge carriers are supplied to fill traps quicker, facilitating improved performance.

The field plate 1365 in any example described herein can be formed from a conductive metal, a conductive metal oxide, or other conductive material that facilitates formation of a flexible structure. In an example, the field plate 1365 herein can be based on gold, platinum copper, tantalum, tin, tungsten, titanium, tungsten, cobalt, chromium, silver, nickel or aluminum, or a binary or ternary system of any of these conductive materials. The thickness of the field plate 1365 can range from about 80 nm to about 100 nm.

Figure 14A:
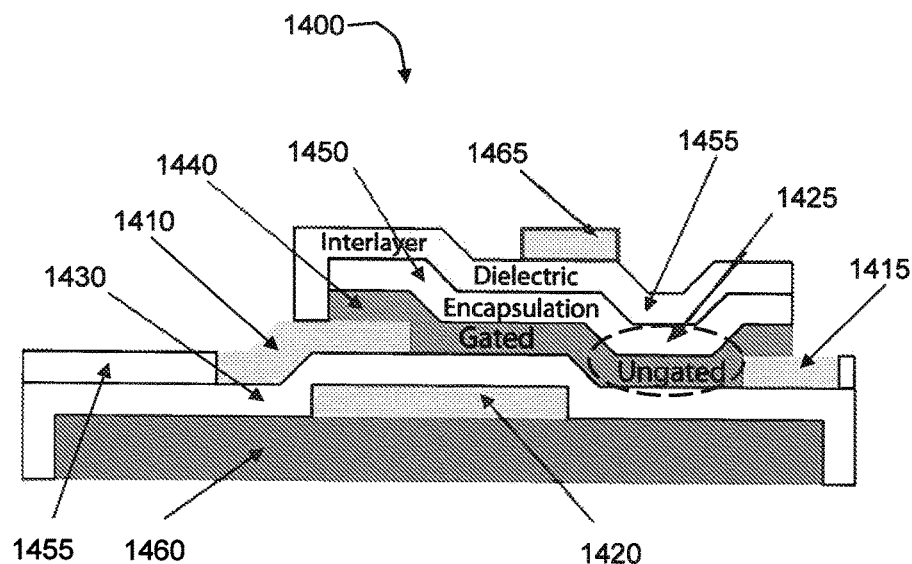
FIGS. 14A and 14B shows the cross-section of other example flexible high-voltage thin film transistors, according to principles of the present disclosure.
Figure 14B:
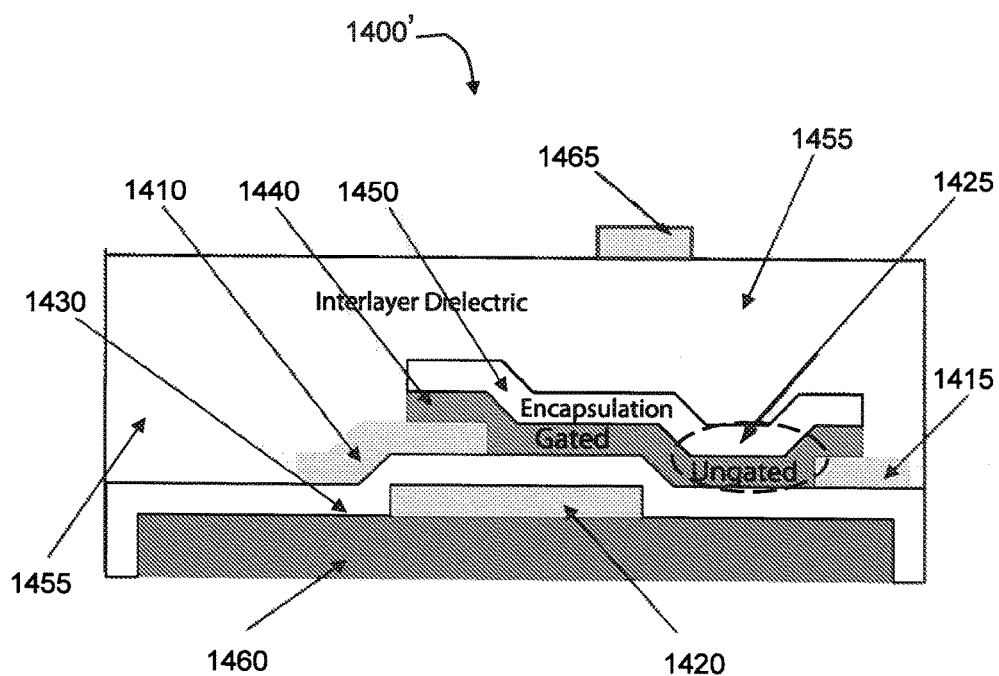

FIGS. 14A and 14B shows the cross-section of yet other example flexible high-voltage thin film transistors 1400 and 1400' according to the principles described herein. The flexible high-voltage thin-film transistors and 1400' include a source electrode 1410, a drain electrode 1415, a gate electrode 1420, a dielectric layer 1430 (also referred to herein as a gate dielectric layer), a flexible semiconductor layer 1440 (as a channel region), an encapsulation layer 1450, and an interlayer dielectric 1455, disposed on a substrate 1460. The descriptions hereinabove of any of the materials composition and layer components of the example flexible high-voltage thin film transistors of FIGS. 3A, 3B, 13A and 13B are applicable to equivalent components of the example device of FIGS. 14A and 14B. As shown in FIGS. 14A and 14B, a first portion of the dielectric layer 1430 is disposed between the gate electrode 1420 and the source electrode 1410 and a second portion of the dielectric layer 1430 is disposed between the gate electrode 1420 and the drain electrode 1415. The flexible semiconductor layer 1440 is disposed between, and in electrical communication with, the source electrode 1410 and the drain electrode 1415. In this example, the dielectric layer 1430 electrically insulates the flexible semiconductor layer 1440 from the gate electrode 1420. As also shown in FIGS. 14A and 14B, the drain electrode 1415 is laterally offset from the gate electrode 1420 by an offset region 1425.

The example flexible high-voltage thin film transistors 1400 and 1400' also include a field plate 1465. The field plate 1465 can be introduced to address fringing fields that can develop near the offset regions of the device, as described above in connection with FIG. 13.

Similarly to as described above in connection with FIG. 13, the field plates 1465 also can be formed from a conductive metal, a conductive metal oxide, or other conductive material that facilitates formation of a flexible structure, including being based on gold, platinum copper, tantalum, tin, tungsten, titanium, tungsten, cobalt, chromium, silver, nickel or aluminum, or a binary or ternary system of any of these conductive materials. The thickness of the field plate 1465 can range from about 80 nm to about 100 nm.

As shown in FIGS. 14A and 14B, portions of the interlayer dielectric 1455 can be disposed between the encapsulation layer 1450 and the field plate 1465. In the example of FIG. 14A, the interlayer dielectric 1455 is configured to substantially conform to portions of the encapsulation layer 1450. In the example of FIG. 14B, the interlayer dielectric 1455 is configured to substantially planarize the device and increase the separation between the encapsulation layer 1450 and the field plate 1465. Each interlayer dielectric 1455 can be formed from any dielectric material, including any type of dielectric material that can be used for the encapsulation layer 1450. For example, the interlayer dielectric 1455 can be formed from parylene-C. The thickness of the interlayer dielectric 1455 can range from about 100 nm to about 400 nm or higher.

Similarly to as described in connection with FIG. 13, fabrication techniques such as photolithography also facilitate multiple processing and patterning, for integration with MEMS or NEMS structures and integrating the field plate as sensitive materials are encapsulated. Furthermore, the precision of patterning achievable with photolithography allows for precise offset lengths and non-standard geometries and configurations.

Figure 15A:
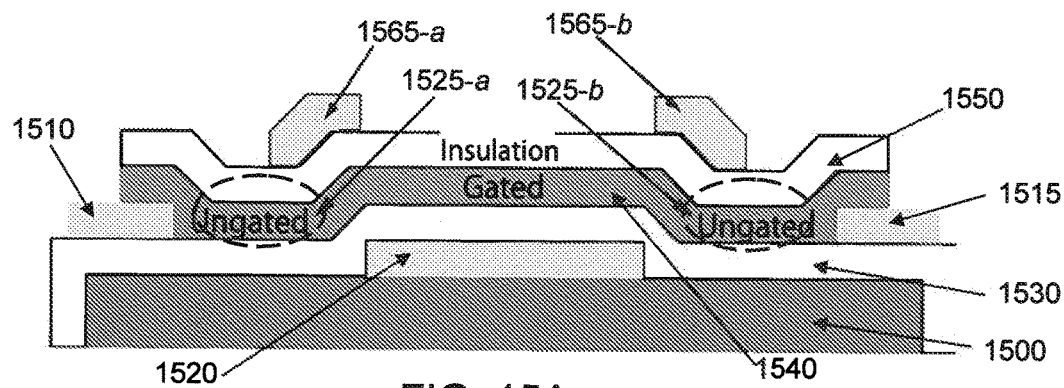
FIGS. 15A to 15D show example configurations of the flexible high-voltage thin film transistors, according to principles of the present disclosure.
Figure 15B:
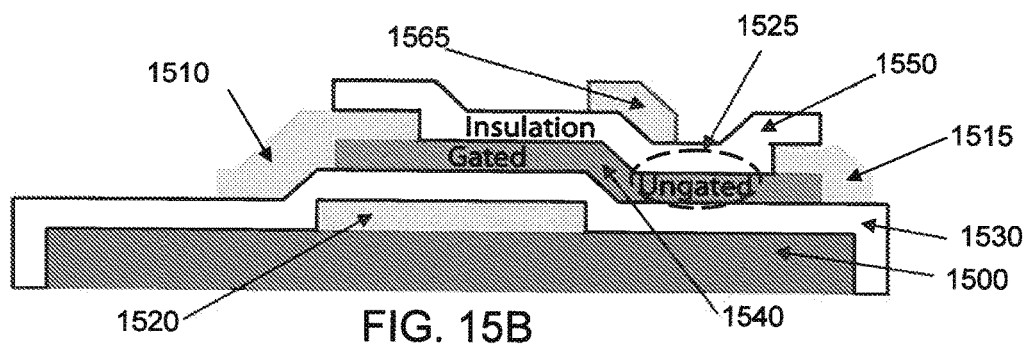
Figure 15C:
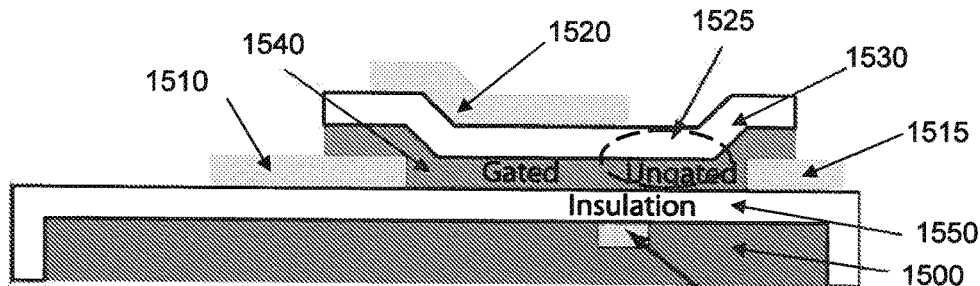
Figure 15D:
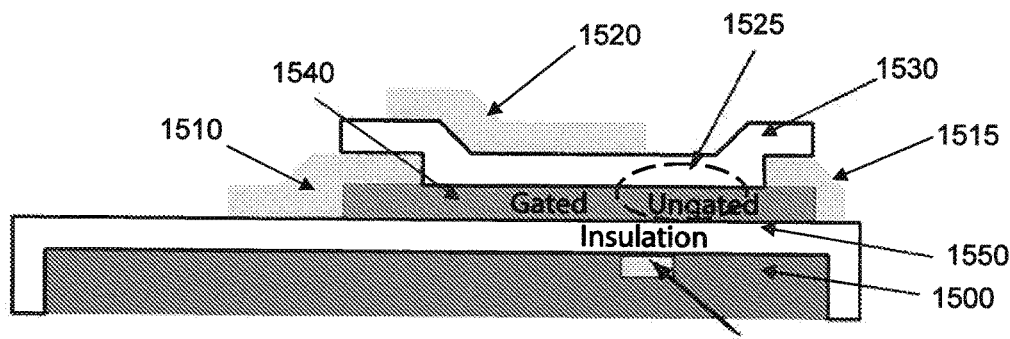

FIGS. 15A to 15D show other example configurations of the flexible high-voltage thin film transistors according to the principles described herein. The descriptions hereinabove of any of the materials composition and layer components of the example flexible high-voltage thin film transistors of FIGS. 3A and 3B are applicable to equivalent components of any example device of FIGS. 15A-15D. FIG. 15A shows an example flexible high-voltage thin-film transistor that includes a source electrode 1510, a drain electrode 1515, a gate electrode 1520, a dielectric layer 1530, a flexible semiconductor layer 1540 (in electrical communication with the source electrode 1510 and drain electrode 1515), and an encapsulation layer 1550, disposed on a substrate 1500. In this example configuration, both the source electrode 1510 and the drain electrode 1515 are offset from the gate electrode by offset regions 1525-*a* and 1525-*b*, respectively. This example configuration also includes field plates 1565-*a* and 1565-*b* that are each disposed above offset regions 1525-*a* and 1525-*b*, respectively. FIG. 15B shows an example flexible high-voltage thin-film transistor that includes a source electrode 1510, a drain electrode 1515, a gate electrode 1520, a dielectric layer 1530, a flexible semiconductor layer 1540 (in electrical communication with the source electrode 1510 and drain electrode 1515), and an encapsulation layer 1550, disposed on a substrate 1500. In this example configuration, there is a single offset region 1525, and portions of both the source electrode 1510 and the drain electrode 1515 are disposed above portions of the flexible semiconductor layer 1540. By comparison, for the flexible high-voltage thin film transistors of FIG. 13, portions of both the source electrode and the drain electrode are disposed below portions of the flexible semiconductor layer. This example configuration also includes a field plate 1565 disposed above offset regions 1525. FIG. 15C shows another example flexible high-voltage thin-film transistor that includes a source electrode 1510, a drain electrode 1515, a gate electrode 1520, a dielectric layer 1530, a flexible semiconductor layer 1540 (in electrical communication with the source electrode 1510 and drain electrode 1515), and an encapsulation layer 1550, disposed on a substrate 1500. In this example configuration, the gate electrode 1520 is disposed as the top layer of the device, while the source electrode 1510, the drain electrode 1515, and the encapsulation layer 1550 form the bottom layers of the device. In addition, there is a single offset region 1525 and a field plate 1565 disposed below offset regions 1525. FIG. 15D shows another example flexible high-voltage thin-film transistor that includes a source electrode 1510, a drain electrode 1515, a gate electrode 1520, a dielectric layer 1530, and a flexible semiconductor layer 1540 (in electrical communication with the source electrode 1510 and drain electrode 1515), and an encapsulation layer 1550, disposed on a substrate 1500. In this example configuration, the gate electrode 1520 is disposed as the top layer of the device, while the source electrode 1510, the drain electrode 1515, and the flexible semiconductor layer 1540 form the bottom layers of the device. Portions of both the source electrode 1510 and the drain electrode 1515 are disposed above portions of the flexible semiconductor layer 1540. In addition, there is a single offset region 1525 and a field plate 1565 disposed below offset regions 1525.

The example flexible high-voltage thin film transistors of FIG. 15A is illustrated as having offset regions 1525-*a* and 1525-*b* that are of substantially similar size. In other examples, the size of the lateral offset of offset region 1525-*a* can be different from the size of the lateral offset of offset region 1525-*b*.

The example flexible high-voltage thin film transistors of FIG. 15A is also illustrated as including two field plates field plates 1565-*a* and 1565-*b*. In other examples, the example flexible high-voltage thin film transistors can include only one field plate, disposed proximate to offset region 1525-*a* or offset region 1525-*b*.

Figure 16:
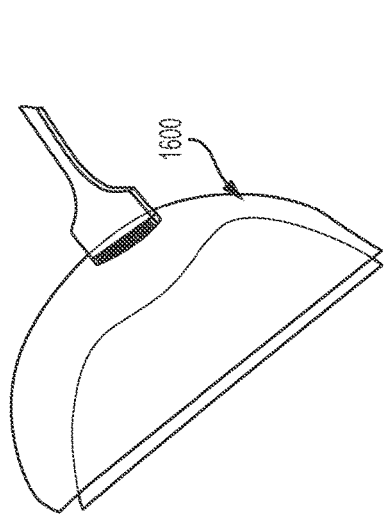
FIG. 16 shows an example flexible substrate, according to principles of the present disclosure.

FIG. 16 shows an example flexible substrate 1600 on which the flexible high-voltage thin film transistors described herein can be disposed. The non-limiting example flexible substrate 1600 is a polyimide. In other examples, the flexible substrate 1600 can be a fabric, a polymer, a plastic, a thin metal foil, a printed circuit board, paper or any combination thereof. In an example implementation, the flexible high-voltage thin film transistors can be fabricated on the flexible substrate 1600 as described herein or using any other applicable method in the art. In another example implementation, the flexible high-voltage thin film transistors described herein can be fabricated on a carrier substrate (e.g., a silicon wafer or glass), separated from the carrier substrate using applicable techniques in the art, and printed on the flexible substrate.

Figure 17:
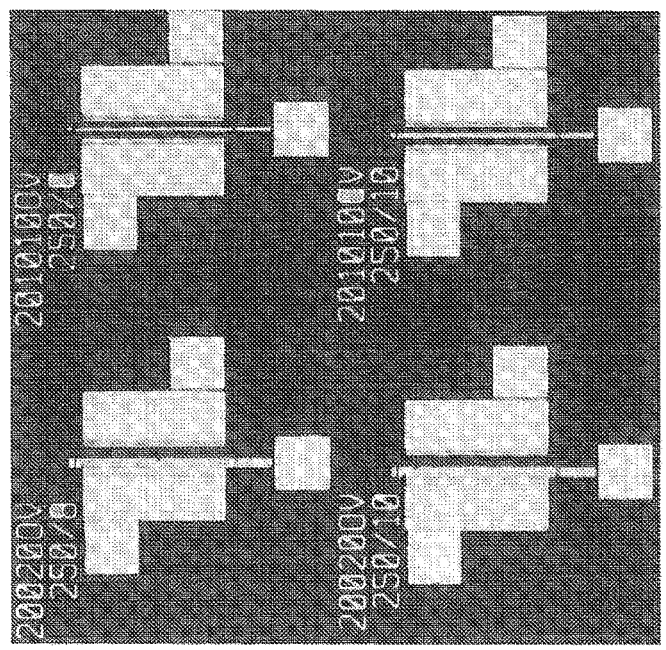
FIG. 17 shows an example array of flexible high-voltage thin film transistors, according to principles of the present disclosure.

FIG. 17 shows an example array of flexible high-voltage thin film transistors, disposed on a substrate. Such an array of flexible high-voltage thin film transistors can be implemented in any system, apparatus or method described herein.

Figure 18:
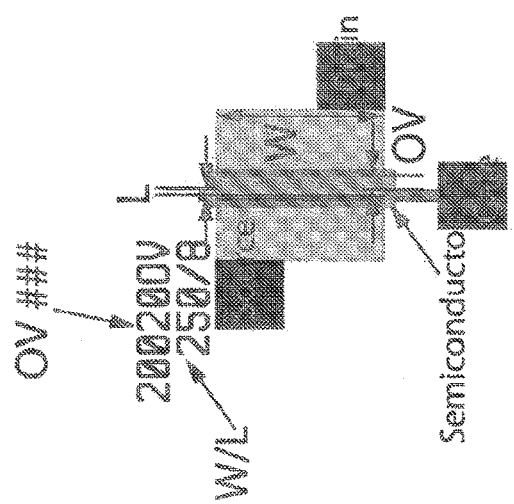
FIG. 18 illustrates the example notation used to provide a reference to specific device structures in an array, according to principles of the present disclosure.
Figure 19A:
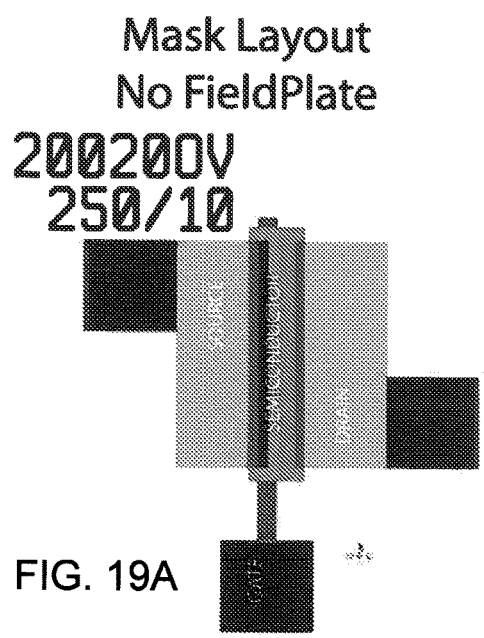
FIGS. 19A to 19D show examples of mask layouts that can be defined for the flexible high-voltage thin-film transistors, according to principles of the present disclosure.
Figure 19C:
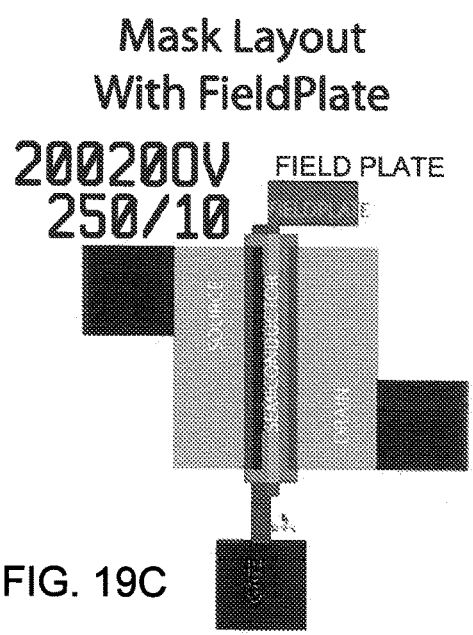
Figure 19B:
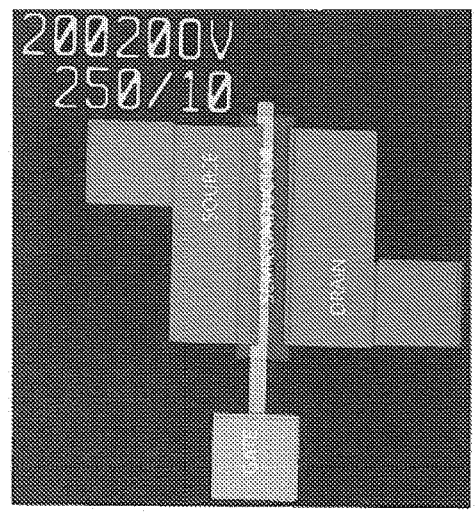
Figure 19D:
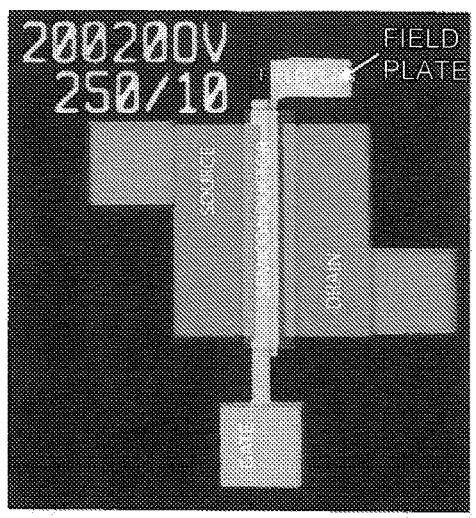

The geometries of the offset regions of the flexible high-voltage thin-film transistors described herein can be defined based on the dimensions from the edge of the gate electrodes to the source or drain electrode. In FIG. 18, a notation is used to provide a reference to specific device structures in the array. FIG. 17 illustrates the notation, where OV ### is used to expresses the offset size and distribution of the dimensions. The symbol "OV" refers to length the offset region (in microns), "L" is the channel length (in microns), and "W" is the channel width (in microns). The first number in the notation represents the dimensions of the total offset. The second number represents the offset of the source; the third number is the offset at the drain. Thus the second number added to the third equals the first. The notation can be used to define a masks for patterning and defining the features of the flexible high-voltage thin-film transistors in an array. In particular, a single fabrication surface may include multiple different types of high-voltage thin-film transistors, according to the differing dimensions of the offset regions, as illustrated in FIG. 18.

Each flexible high-voltage thin-film transistors in FIG. 17 is labeled based on the example notation described in FIG. 18. In the example device at the upper left of FIG. 17, the notation "OV20020" is used to indicate a flexible high-voltage thin-film transistor with 20 μm of total offset, with 0 μm offset at the source and 20 μm offset at the drain. For the example device at the upper right of FIG. 17, the notation "OV201010" is used to indicate a flexible high-voltage thin-film transistor with 20 μm of total offset, with 10 μm offset at the source and 10 μm offset at the drain. Example flexible high-voltage thin-film transistors with the asymmetric offset structure at the drain as described herein show stable performance during operation at high voltages. Example flexible high-voltage thin-film transistors also can be configured to include an offset region at the source as well as at the drain (see, e.g., FIGS. 12A and 15A). Results of measurements of flexible high-voltage thin-film transistor devices described herein having an offset structure at the source demonstrate that placing the offset at the source can improve device saturation and may be useful in an application where stable device saturation is a priority over drive current. In addition, a, example flexible high-voltage thin-film transistor having offset regions at both the source and the drain can exhibit improved voltage control and reliability.

FIGS. 19A to 19D show examples of the masks that can be defined for the flexible high-voltage thin-film transistors based on the notation described herein. For asymmetric devices, the OV##0 structure is physically the same as the OV#0# structure. By switching the source and drain probes on the asymmetric device structure, measurements for both the OV#0# structure and the OV##0 structure can be obtained from a single device. The mask shown in FIG. 19A defines the fabricated structure of FIG. 19B, which does not include a field plate. The mask shown in FIG. 19C defines the fabricated structure of FIG. 19D, which includes a field plate.

Figure 20:
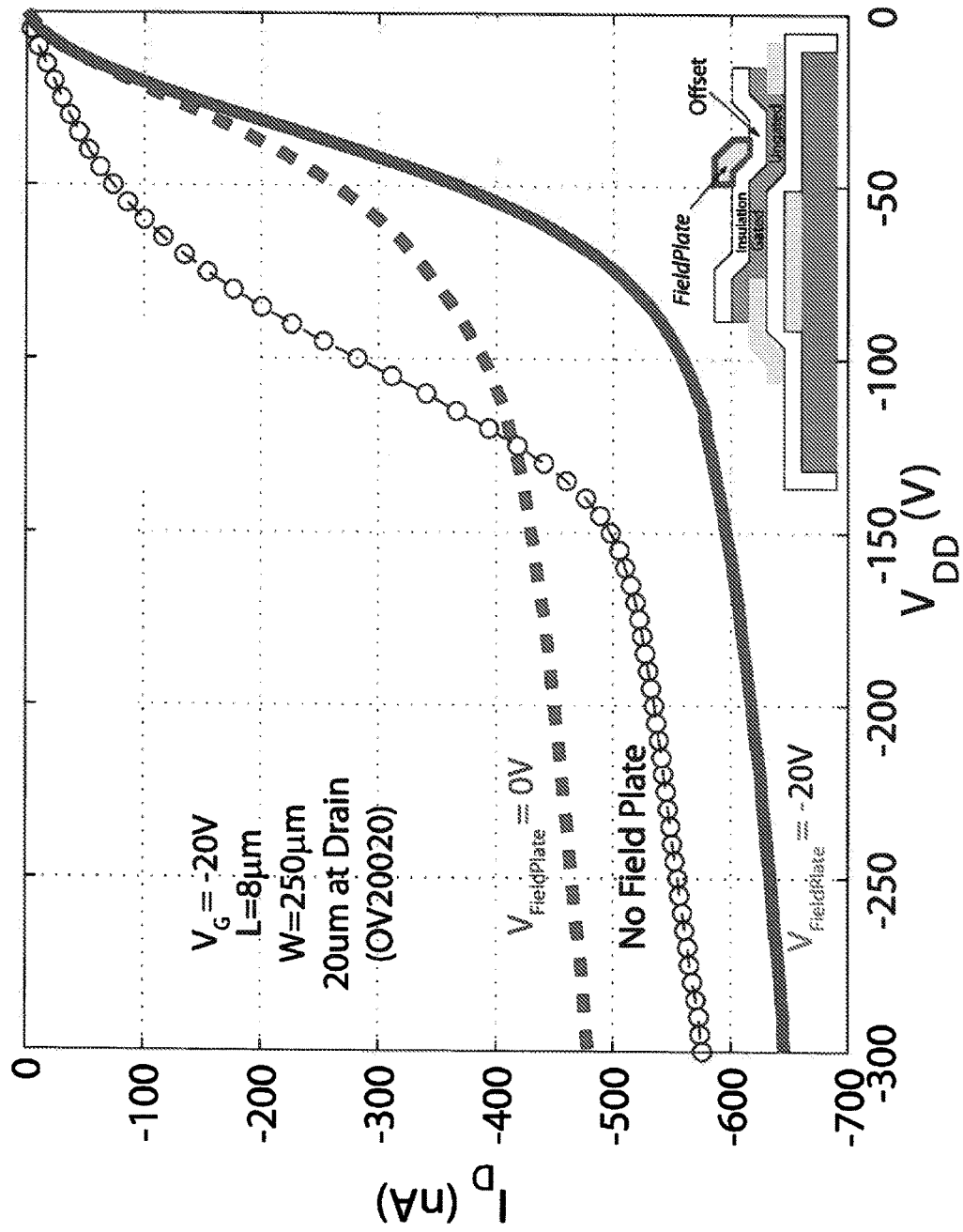
FIG. 20 shows measurements of current ($I_D$) vs voltage ($V_{DD}$) at a gate voltage ($V_G$) of −20V for an example flexible high-voltage thin film transistor, according to principles of the present disclosure.

FIG. 20 shows measurements of current ($I_D$) vs voltage ($V_{DD}$) at a gate voltage ($V_G$) of −20V for an example flexible high-voltage thin film transistor (an OV20020 structure) according to the principles described herein that includes a field plate as compared to a flexible high-voltage thin film transistor that does not include a field plate. Two sets of measurements are shown for the field plate of the OV20020 structure, one with the field plate being held at $V_{Fieldplate}$=0V, the other with the field plate held at $V_{Fieldplate}$=−20V. As shown in FIG. 20, both the flexible high-voltage thin film transistor with and without the field plate maintain stable operation at high voltages (up to −300V). As also shown in FIG. 20, the current ($I_D$) rises more slowly in magnitude with larger magnitude voltages ($V_{DD}$) in the flexible high-voltage thin film transistor without a field plate, which can be due to a charge injection barrier that can be created as a result of the high voltage operation. By comparison, the current ($I_D$) rises more quickly in the flexible high-voltage thin film transistor with the field plate, for both measurements taken with $V_{Fieldplate}$=0V and with $V_{Fieldplate}$=−20V. As described above, the field plate can serve to address fringing fields that can develop near the offset region of the flexible high-voltage thin film transistor. These fringing electric fields can exert an influence on conductors that are not immediately below the gate, resulting in reduced performance of a device. The field plate also can be implemented to make the offset region more conductive. As a result, more charge carriers are supplied to fill traps quicker, facilitating improved performance. As shown in FIG. 20, the current ($I_D$) magnitude rise for $V_{Fieldplate}$=−20V is faster than for $V_{Fieldplate}$=0V as $V_{DD}$ goes from 0V to about −75V.

Systems, apparatus and methods according to the principles described herein also can include a flexible substrate, a driver circuit formed on the flexible substrate, and a plurality of micro-electro-mechanical system (MEMS) or nano-electro-mechanical system (NEMS) devices formed on the flexible substrate. The driver circuit can include at least one of the flexible high-voltage thin-film transistors described herein. The drain electrode of each of the flexible high-voltage thin-film transistors is configured to be in electrical communication with at least one of the MEMS or NEMS devices. In an example, the driver circuit and MEMS or NEMS devices can be formed in an array on the flexible substrate. The drive voltages of the flexible high-voltage thin-film transistors can be used to activate the MEMS or NEMS devices.

Figure 22:
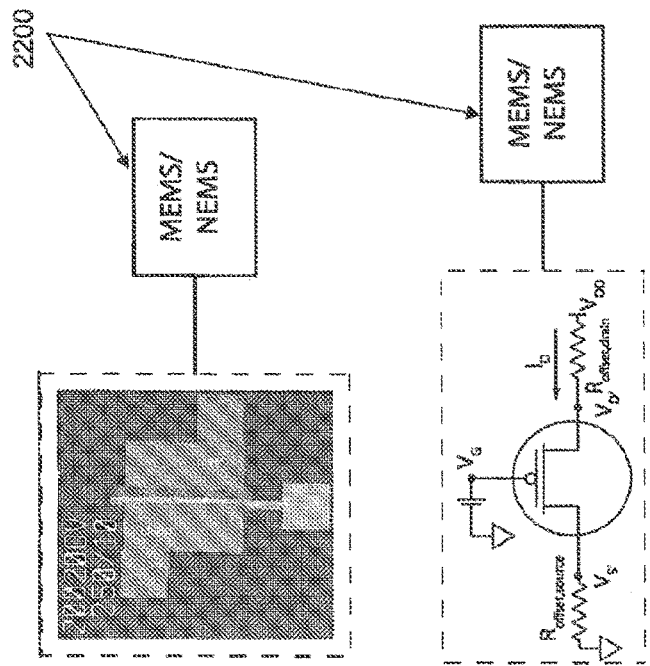
FIG. 22 shows a non-limiting example of the electrical coupling of flexible high-voltage thin-film transistor components with MEMS or NEMS elements, according to principles of the present disclosure.
Figure 21:
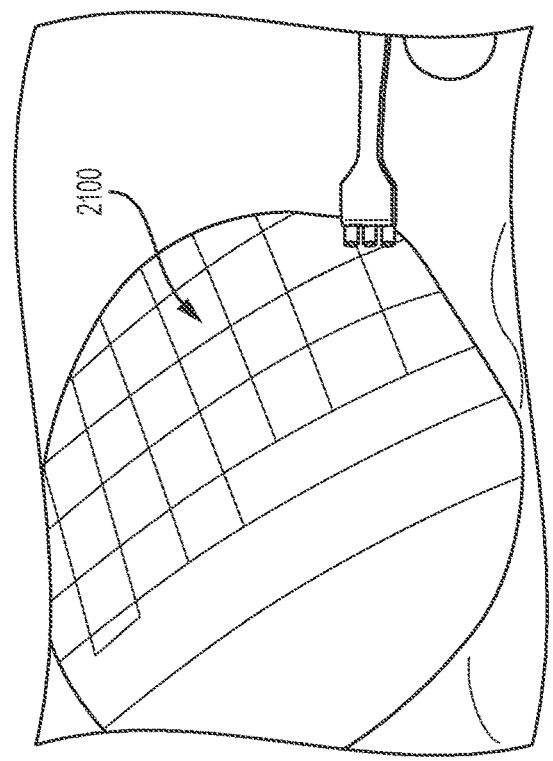
FIG. 21 shows an example array of circuit elements on a flexible substrate, according to principles of the present disclosure.

FIG. 21 shows an example array 2100 of example circuit components fabricated on a flexible substrate. Similar techniques used for forming the example circuit components can be used to fabricate flexible MEMS or NEMS, and driver circuits including flexible high-voltage thin-film transistors, on a flexible substrate, according to the systems, methods, and apparatus described herein. FIG. 22 shows a non-limiting example of a transistor component in electrical communication to a MEMS or NEMS element 2200. In an example, at least one example flexible high-voltage thin-film transistor can be included in a driver circuit that is in communication with the MEMS or NEMS element 2200.

The systems, apparatus and methods described herein provide flexible high-voltage thin-film transistors that facilitate the switch of high voltages (including voltages up to 700 V and above as described above) using a small controlling gate voltage (e.g., 20V or less). As described above, it facilitates the control and actuation of piezomaterials. The processing and materials compositions described herein provide flexible high-voltage thin-film transistors that are compatible with flexible substrates. The systems, apparatus and methods described herein are reproducible and scalable to facilitate large-scale production. The systems, apparatus and methods described herein also provide patterning methods that facilitate ease of integration with other components in the system, including MEMS or NEMS components or other imaging components.

In an example implementation, a gantry-free x-ray detector or imaging blanket can be formed from a driver circuit formed with a plurality of flexible high-voltage thin-film transistors and a plurality of MEMS or NEMS devices in electrical communication with the driver circuit. The MEMS or NEMS devices can include piezoelectric components that cause at least a portion of a flexible substrate of the x-ray detector or imaging blanket to change conformation in response to non-zero drive voltages. The imaging blanket can be used, for example, with a CT scanning unit, where it is draped over the individual or object being scanned. Application of the drive voltages causes the piezoelectric components of the MEMS or NEMS devices to change the shape of the blanket, so that the blanket substantially conforms to equipotential surfaces of the fields of the CT scanning unit, resulting in enhancement of the signal from the individual or object, and a resultant improved measurement or image.

Figure 23B:
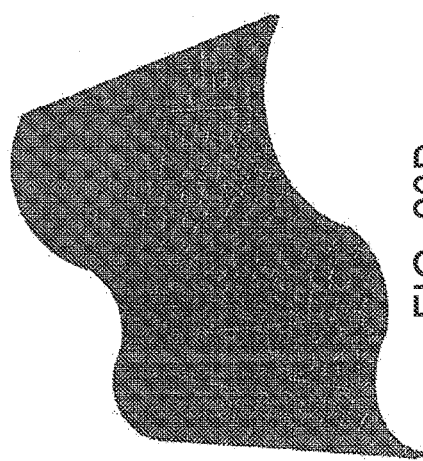
FIG. 23B shows an example detector and imaging blanket, according to principles of the present disclosure.
Figure 23D:
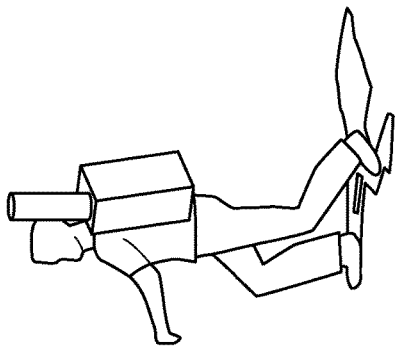
FIGS. 23C and 23D show potential applications of the imaging blanket, according to principles of the present disclosure.
Figure 23A:
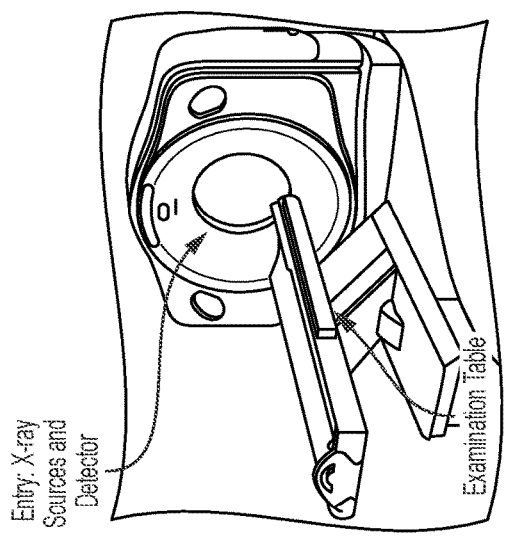
FIG. 23A shows an example CT scanner and examination table, according to principles of the present disclosure.
Figure 23C:
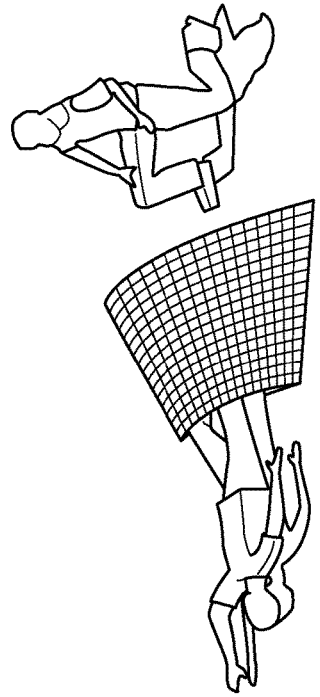

FIG. 23A shows an example CT scanner and examination table with which an imaging blanket (illustrated in FIG. 23B) can be used. In computed tomography, scans are made by rotating an x-ray beam around a patient and imaging the body in a series of "slices." A computer merges these "slices" to provide a final image. The digital imaging pixels should be precisely aligned to the incident x-rays to provide an optimal image. The imaging blanket described herein can be configured with embedded x-ray detectors and imaging circuits to enhance the imaging capabilities of the CT scanner. Piezoelectric components associated with MEMS or NEMS devices can be actuated by the drive voltages from the flexible high-voltage thin film transistors described herein and can shape selected portions of the imaging blanket such that it can be used for alignment. For example, the high voltages that can be maintained at the drain of the flexible high-voltage thin-film transistors describe herein can be used to actuate the many piezoelectric materials in the imaging blanket to change shape of the blanket, e.g., such that the imaging blanket conforms to equipotential surfaces of the fields of the CT scanning unit. FIGS. 23C and 23D show other potential applications of the imaging blanket, including in military applications, security applications, and cargo inspection applications. Aromatic hydrocarbons are good scintillators and glow in the presence of x-ray. Therefore, systems or apparatus that include flexible high-voltage thin-film transistors with an aromatic hydrocarbon as part of the flexible semiconductor layers and/or the dielectric layers can be used to give an indication of the presence of x-rays. In another example implementation, an x-ray detector that includes the flexible high-voltage thin-film transistors described herein can be used for high-precision alignment in high-field applications.

Systems, apparatus and methods according to the principles described herein can include the example flexible high-voltage thin-film transistors, or apparatus that includes the example flexible high-voltage thin-film transistors, that are arranged as separately addressable elements in an array. In an imaging application, the example system or apparatus can be configured as including one or more arrays of sensor elements, each sensor element being coupled with at least one flexible high-voltage thin-film transistor. For example, as shown in FIG. 24, an image sensor can be formed from one or more sensor regions 2400, each sensor region including an array of sensor elements 2402. Each sensor element 2402 can include one or flexible high-voltage thin-film transistor, or a plurality flexible high-voltage thin-film transistor. FIG. 24 shows a non-limiting example of an arrangement of flexible high-voltage thin-film transistor 2406 that are included in a sensor element. The image sensor may also include regions 2404 that do not include sensor elements. In an example implementation, sensor elements 2402 can be formed as pixels of an image sensor.

Figure 25:
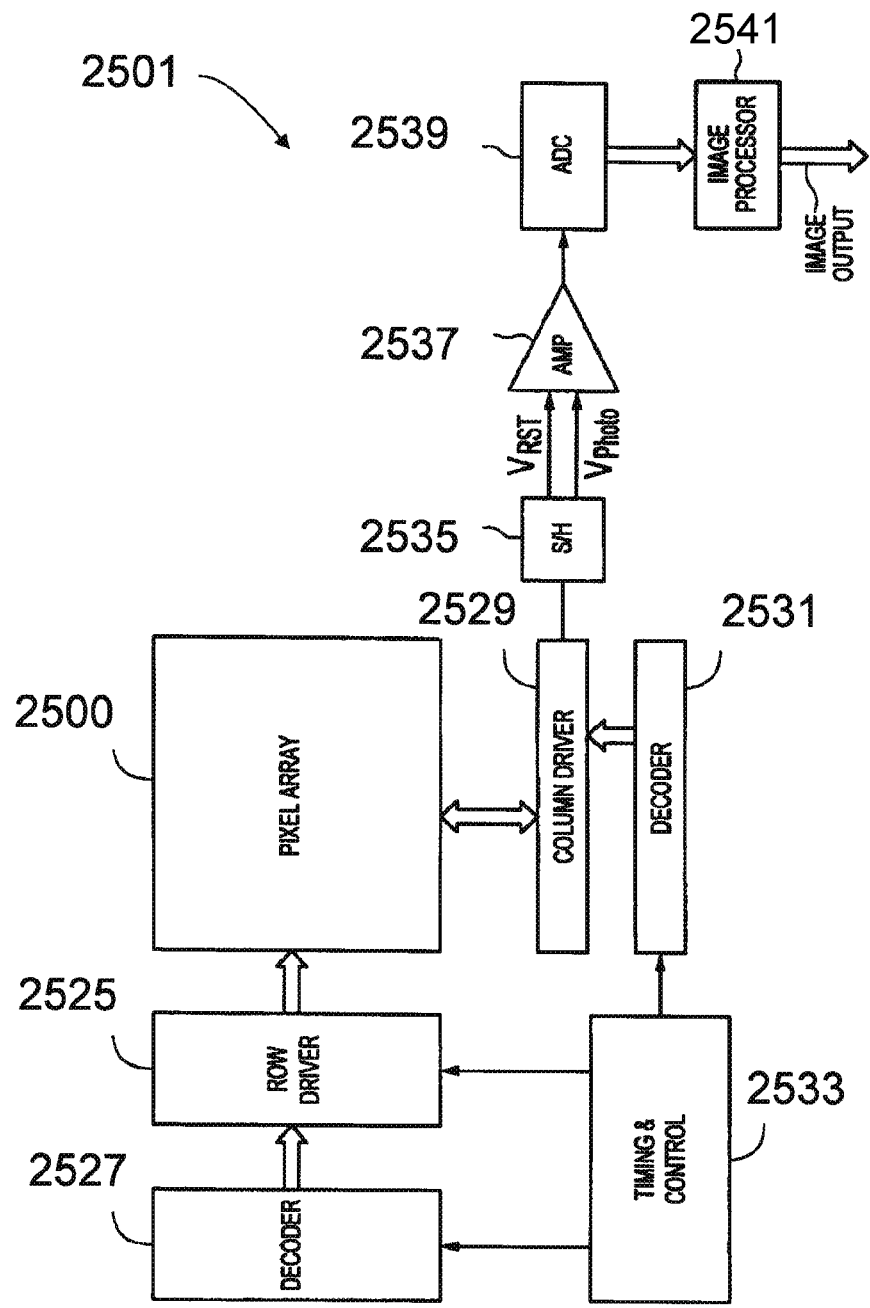
FIG. 25 is a block diagram showing the components of a non-limiting example of an image sensor, according to principles of the present disclosure.

FIG. 25 is a block diagram showing the components of a non-limiting example of an image sensor. The image sensor can be a complementary metal-oxide-semiconductor (CMOS) image sensor 2501 that includes a pixel array 2500. The pixel array 2500 can be formed from an array of the image sensors of FIG. 24. In an example, the pixel array 2500 is formed with pixel cells arranged in a predetermined number of columns and rows, where a pixel cell includes a sensor element. The pixel array 2500 can be used to capture incident radiation from an x-ray source and convert the captured radiation to electrical signals, such as analog signals.

The electrical signals obtained and generated by the pixel cells in the pixel array 2500 can be read out, row by row, to provide image data of the captured image. For example, pixel cells in a row of the pixel array 2500 are all selected for read-out at the same time by a row select line, and each pixel cell in a selected column of the row provides a signal representative of received x-ray radiation to a column output line. That is, each column also has a select line, and the pixel cells of each column are selectively read out onto output lines in response to the column select lines. The row select lines in the pixel array 2500 are selectively activated by a row driver 2525 in response to a row address decoder 2527. The column select lines are selectively activated by a column driver 2529 in response to a column address decoder 2531.

The image sensor 2501 can also include a timing and controlling circuit 2533 that generates one or more read-out control signals to control the operation of the various components in the image sensor 2501. For example, the timing and controlling circuit 2533 can control the address decoders 2527 and 2531 in any of various conventional ways to select the appropriate row and column lines for pixel signal read-out.

The electrical signals output from the column output lines typically include a pixel reset signal ($V_{RST}$) and a pixel image signal ($V_{Photo}$) for each image pixel cell in a CMOS image sensor. In an example of an image pixel array 2500 containing four-transistor CMOS image pixel cell, the pixel reset signal ($V_{RST}$) can be obtained from a floating diffusion region when it is reset by a reset signal RST applied to a corresponding reset transistor, while the pixel image signal ($V_{Photo}$) is obtained from the floating diffusion region when charge is transferred to the floating diffusion region. Both the $V_{RST}$ and $V_{Photo}$ signals can be read into a sample and hold circuit (S/H) 2535. Although the image sensor 2501 illustrated is a CMOS image sensor, other types of solid state sensors, pixel arrays, and readout circuitries also may be used. Image sensor 1501 may further comprise amplifier 2537, analog-to-digital converter (ADC) 2539 and image processor 2541.

The principles described in connection with FIG. 25 for row-by-row reading of a signal also may be applied for row-by-row actuation of MEMS or NEMS elements (including actuation of piezoelectric elements) of the x-ray detector and imaging blankets described hereinabove. For example, MEMS or NEMS elements can be selectively actuated, using the row-by-row separately addressable circuitry, for changing the shape of selective portions of the x-ray detector and imaging blankets.

Figure 26:
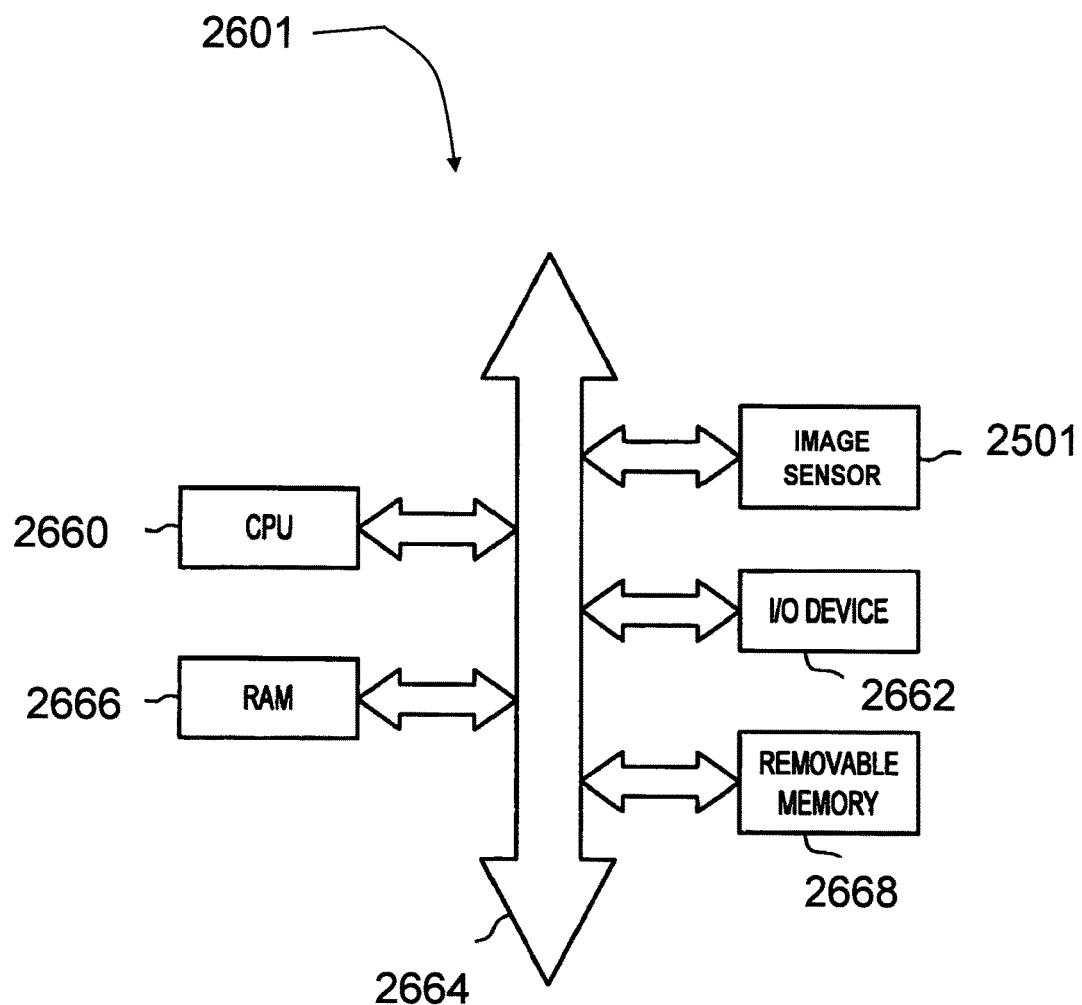
FIG. 26 illustrates an example processing system that includes an image sensor, according to principles of the present disclosure.

FIG. 26 illustrates an example processing system 2601 that includes an image sensor 2501. The image sensor 2501 may be combined with a processor, such as a CPU, digital signal processor, or microprocessor, with or without memory storage, on a single integrated circuit or on a different chip than the processor. In the example shown in FIG. 26, the processing system 2601 includes a central processing unit (CPU) 2660, such as a microprocessor, that communicates with an input/output (I/O) device 2662 over a bus 2664. The processing system 2601 also can include random access memory (RAM) 2666 and/or removable memory 2668, such as but not limited to flash memory, which can communicate with CPU 2660 over the bus 2664.

The processing system 2601 can be any of various systems having digital circuits that could include the image sensor 2501. As a non-limiting example, processing system 2601 could include a computing system. In the example shown in FIG. 26, the processing system 2601 can be included in a camera used for x-ray detection or for detection of electromagnetic radiation at other frequencies. Incident electromagnetic radiation (e.g., that enters through the camera) impinges on and resonates with one or more detector elements of the pixel array 2500 (see FIG. 25). The generated charge carriers can be detected according to any example described herein.

While the example of FIGS. 25 and 26 are described with reference to a CMOS image sensor, the detector elements and sensor elements according to principles herein can be implemented in other solid state image sensor technology, including charge-coupled device (CCD) technology or hybrid CCD/CMOS technology. In an example, the image sensors herein are CCD image sensors.

CCD image sensor devices can differ from CMOS sensor devices in where the timing and controlling circuitry as located relative to the sensor elements. As described above, a CMOS image sensor includes an active pixel array with timing and controlling circuitry coupled with some or all of the sensor elements. The CMOS image sensor device can include other circuitry for converting measured change in conductivity (as described above) to digital information. Also, a CMOS image sensor device can be cheaper to manufacture, can be implemented with fewer components, use less power, and/or provide faster read-out than a CCD image sensor device.

In an example CCD image sensor, the timing and controlling circuitry may not be located on the same substrate as the sensor elements but rather can be located elsewhere in the imaging sensor device. The measures of the changes in conductivity (as described above) can be sampled one pixel at a time as they are read-out from the pixel array. The CMOS image sensor device can include other circuitry for converting measured change in conductivity (as described above) to digital information. A CCD image sensor can give essentially the same quality performance as a CMOS image sensor device and is a more mature technology.

In another example, the detector elements and sensor elements according to principles herein can be implemented in hybrid CCD/CMOS technology. Such hybrid CCD/CMOS technology is expected to exhibit the benefits of both CCD image sensors and CMOS image sensors. A hybrid CCD/CMOS image sensor can be formed from CMOS readout integrated circuitry (ROIC) that is registered with and bump bonded to CCD image sensor substrates. In this example, the CCD image sensors and ROIC are fabricated separately and later combined. That is, the sensor elements can be fabricated by bonding circuit elements above the detector elements or the sensor elements to provide the hybrid CCD/CMOS image sensor configuration. In an example, the bonding can be facilitated using metallic interconnects that couple each of a number of circuit elements to each of a corresponding number of detector elements or sensor elements. Non-limiting examples of bonding agent include an oxide of silicon, such as spin-on glass, and polymers, such as parylene, polyimides, benzocyclobutene, photo-resists, and polymethylsiloxane. In another example, the hybrid CCD/CMOS technology can be formed using CMOS fabrication techniques. That is, the CMOS fabrication techniques are utilized to fabricate CCD-like image sensors, with sensor element and circuitry configurations having the finer dimensions achievable with CMOS technology.

Other non-limiting example applications of an apparatus, detector, image sensor, or other device or system described herein include in security, military, and industrial applications. Imaging using a system or apparatus described herein can be incorporated into security applications and industrial process control. The systems and apparatus described herein can be implemented in spectroscopic applications and military uses as well.

In another non-limiting example, an apparatus, detector, image sensor, device or system described herein can be made low-cost and/or disposable.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy disks, compact disks, optical disks, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media can be transportable, such that the program or programs stored thereon can be loaded onto one or more different computers or other processors to implement various aspects of the present technology as discussed above.

The terms "program" or "software" are used herein in a generic sense to refer to any type of computer code or set of computer-executable instructions that can be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A flexible high-voltage thin-film transistor comprising:
   a gate electrode;
   a source electrode;
   a drain electrode;
   a dielectric layer, wherein a first portion of the dielectric layer is disposed between the gate electrode and the source electrode, and wherein a second portion of the dielectric layer is disposed between the gate electrode and the drain electrode; and
   a flexible semiconductor layer disposed between, and in electrical communication with, the source electrode and the drain electrode, the flexible semiconductor layer being electrically insulated from the gate electrode, and the flexible semiconductor layer comprising an ungated region laterally separating the gate electrode from the drain electrode.

2. The flexible high-voltage thin-film transistor of claim 1, wherein the dielectric layer has a dielectric constant that is higher than about 4.0.

3. The flexible high-voltage thin-film transistor of claim 1, wherein the dielectric layer has a dielectric constant that is higher than about 4.3, about 4.5, about 4.8, about 5.0, about 5.3, about 5.5, about 6.0, about 6.5, or about 7.0.

4. The flexible high-voltage thin-film transistor of claim 1, wherein the dielectric layer comprises an organic material, an inorganic material, or a small molecule.

5. The flexible high-voltage thin-film transistor of claim 4, wherein the organic dielectric material comprises a parylene, a polyvinylphenol, a polyvinylalchohol, a polythienylene vinylene, a functionalized pentacene, a polydimethylsiloxane, or any combination thereof.

6. The flexible high-voltage thin-film transistor of claim 4, wherein the inorganic dielectric material comprises s an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

7. The flexible high-voltage thin-film transistor of claim 4, wherein the inorganic dielectric material comprises aluminum oxide, bismuth zinc niobate, hafnium oxide, barium strontium titanate, silicon nitride, or any combination thereof.

8. The flexible high-voltage thin-film transistor of claim 1, wherein the flexible semiconductor layer is formed from amorphous silicon deposited at a temperature below about 200° C., about 300° C., about 400° C., about 800° C., or about 1200° C.

9. The flexible high-voltage thin-film transistor of claim 1, wherein the flexible semiconductor layer is formed from a pentacene or a tetracene.

10. The flexible high-voltage thin-film transistor of claim 1, wherein, in operation, a voltage at the drain electrode can be maintained at greater than about 70V, about 85V, about 100V, about 125V, about 150V, about 200V, about 300V, about 400V, about 550V, or about 700V.

11. The flexible high-voltage thin-film transistor of claim 1, further comprising a field plate disposed proximate to the flexible semiconductor layer at an area between the gate electrode and the drain electrode, wherein the field plate comprises a conductive material.

12. The flexible high-voltage thin-film transistor of claim 1, wherein the dielectric layer comprises a composite of an organic dielectric material and an inorganic dielectric material.

13. The flexible high-voltage thin-film transistor of claim 12, wherein the organic dielectric material has a breakdown capacity of greater than about $10^6$ V/cm.

14. The flexible high-voltage thin-film transistor of claim 12, wherein the inorganic dielectric material has a dielectric constant of greater than about 7.0.

* * * * *